(12) United States Patent  (10) Patent No.: US 8,051,239 B2
Nieminen  (45) Date of Patent: Nov. 1, 2011

(54) MULTIPLE ACCESS FOR PARALLEL TURBO DECODER

(75) Inventor: Esko Nieminen, Oulu (FI)

(73) Assignee: Nokia Corporation, Espoo (FI)

( * ) Notice: Subject to any disclaimer, the term of this patent is extended or adjusted under 35 U.S.C. 154(b) by 352 days.

(21) Appl. No.: 11/810,199

(22) Filed: Jun. 4, 2007

(65) Prior Publication Data

US 2008/0301383 A1    Dec. 4, 2008

(51) Int. Cl.
*G06F 12/00* (2006.01)
(52) U.S. Cl. ............................................ 711/5; 711/157
(58) Field of Classification Search ........... 711/E12.079, 711/157; 708/421, 409, 406, 408
See application file for complete search history.

(56) References Cited

U.S. PATENT DOCUMENTS

| | | | |
|---|---|---|---|
| 5,081,575 A * | 1/1992 | Hiller et al. ................... | 710/317 |
| 5,938,790 A | 8/1999 | Marrow ......................... | 714/795 |
| 6,604,166 B1 * | 8/2003 | Jana et al. ..................... | 711/5 |
| 6,654,927 B1 | 11/2003 | Sall et al. ...................... | 714/786 |
| 6,888,901 B2 | 5/2005 | Yu et al. ........................ | 375/341 |
| 6,898,254 B2 | 5/2005 | Wolf et al. .................... | 375/340 |
| 6,904,555 B2 | 6/2005 | Nagase et al. ................ | 714/751 |
| 6,950,977 B2 | 9/2005 | Lavi et al. ..................... | 714/94 |
| 6,988,233 B2 | 1/2006 | Kanai et al. ................... | 714/755 |
| 2004/0168011 A1 * | 8/2004 | Hemming ....................... | 711/5 |
| 2007/0234180 A1 | 10/2007 | Edmonston et al. .......... | 714/759 |

FOREIGN PATENT DOCUMENTS

WO   WO 95/17787   6/1995

OTHER PUBLICATIONS

D.S Dawoud, "An Effective Memory Addressing Scheme for Multiprocessor FFT System", IEEE 2002, all.*
Moussa et al., "Butterfly and Benes-Based-On-Chip Communication Networks for Multiprocessor Turbo Decoding", IEEE, Apr. 2007, all.*
Salmela et al., "Parallel Memory Access in Turbo Decoders", IEEE, 2003, all.*
Takala et al., "Conflict Free Parallel Memory Access Scheme for FFT Processors", IEEE 2003, all.*
Rauber et. al., Parallel Programming For Multicore and Cluster Systems, 2010, p. 43, http://books.google.com/books?id=S3IYT6iDAUYC&pg=PA43&lpg=PA43&dq=butterfly+networks,+omega+networks&source=bl&ots=mrQPkd-yZN&sig=f4Q9ZD5HaCZV9IS8OnaUYJZhb3Q&hl=en&ei=BR8ITbaDF4KB8gaBzaS0AQ&sa=X&oi=book_result&ct=result&resn.*
"Real-Time Algorithms and VLSI Architectures for Soft Output Map Convolutional Decoding",, Dawid, H., et al., in 6th IEEE International Symposium on Personal, Indoor and Mobile Radio Communications, Toronto, Canada, vol. 1, pp. 193-197, Sep. 1995.

(Continued)

*Primary Examiner* — Reginald Bragdon
*Assistant Examiner* — Arvind Talukdar
(74) *Attorney, Agent, or Firm* — Harrington & Smith

(57) ABSTRACT

A memory bank contains a plurality of memories, a first Butterfly network is configured to apply memory addresses to the memory bank, and a second Butterfly network is configured to pass data to or from the memory bank. A control signal is generated for the first and second Butterfly networks in accordance with a multiple access rule to enable parallel access to the memory bank, without memory access conflict, for one of a linear order and an interleaved order. The method and apparatus is particularly advantageous for use in turbo decoding.

48 Claims, 17 Drawing Sheets

OTHER PUBLICATIONS

"Memory Efficient Implementation of the BCJR Algorithm, in Proceedings of the $2^{nd}$ International Symposium on Turbo Codes and Related Topics", Huettinger, S. et al., Brest, France, Sep. 4-7, 2000, pp. 479-482.

Takeshita, O. Y., "On Maximum Contention-Free Interleavers and Permutation Polynomials Over Integer Rings," Mar. 3, 2006, pp. 1249-1253, IEEE Transactions on Information Theory, vol. 52, No. 3.

Benedetto, S. et al., "Design issues on the parallel implementation of versatile, high-speed iterative decoders," Apr. 3-7, 2006, 10 pages, Turbo—Coding—2006, Munich.

Tarable, A. et al., "Mapping Interleaving Laws to Parallel Turbo and LDPC Decoder Architectures," Sep. 2004, pp. 2002-2009, IEEE Transactions on Information Theory, vol. 50, No. 9.

Gnaedig, D. et al., "Les Turbo-Codes à Roulettes", Internet Citation, XP-002387617, (retrieved Jun. 27, 2006).

Tarable, A et al., "Mapping interleaving laws to parallel Turbo decoder architectures", Internet Citation, Jan. 4, 2005, XP-002464595.

When N: "Soc-Network for Interleaving in Wireless Communications", Internet Citation, Jul. 2004, XP-002464593, pp. 1-13.

"Access and Alignment of Data in an Array Processor". Duncan H. Lawrie. IEEETransactions on Computers, vol. C-24, No. 12, Dec. 1975 (pp. 1145-1155).

"Crossbar Switch". Wikipedia.< http:/en.wikipedia.org/wiki/Crossbar_switch> [(6 pages) accessed May 19, 2010].

"Omega Network" Wikipedia. http://en.wikipedia.org/wiki/Omega_network [(2pages) accessed May 19, 2010].

"Mapping Interleaving Laws to Parallel Turbo and LDPC Decoder Architectures", Alberto Tarable et al., IEEE Transactions On Information Theory, vol. 50, No. 9, Sep. 2004, pp. 2002-2009.

" Mapping Interleaving Laws to Parallel Turbo Decoder Architectures", Alberto Tarable, et al., IEEE Communications Letters, vol. 8, No. 3, Mar. 2004, pp. 162-164.

"A network-oriented inter-block permutation to enhance Rel'6 turbo coding throughput", HighDimension Ltd., 3GPP TSG RAN WG1#46, R1-062153, Sep. 2006, pp. 1-10.

"A low power implementation-oriented turbo coding interleaver", ITRI, 3GPP TSG RAN WG1 Meeting #47, R1-063455, Nov. 2006, pp. 1-16.

"A Contention-Free Memory Mapping for ARP interleavered Turbo Codes of Arbitrary Sizes", Broadcom, 3GPP TSG RAN WG1 #47, R1-063243, Nov. 2006, pp. 1-11.

"IBP interleaver for turbo coding and shortening position assigning algorithm", ITRI, 3GPP TSG RAN WG1 Meeting #47, R1-070112, Jan. 2007, pp. 1-14.

"Flexible and Formulaic Collision-free Memory Accessing for Parallel Turbo decoding with Quadratic polynomial permutation (QPP) Interleave", Broadcom, 3GPP TSG RAN WG1 #47 BIZ, R1-070618, Jan. 2007, pp. 1-5.

"Approved Report of 3GPP TSG RAN WG1 #47bis v2.0.0", MCC Support, 3GPP TSG RAN WG1 Meeting #48, R1-071245, Feb. 2007, pp. 1-116.

"Approved Report of 3GPP TSG RAN WG1 #47", MCC Support, 3GPP TSG RAN WG1 Meeting #47bis, R1-070633, Jan. 2007, pp. 1-110.

* cited by examiner

TABLE 1

| i | T(i) | i | T(i) | i | T(i) | i | T(i) |
|---|---|---|---|---|---|---|---|
| 0 | 88 | 26 | 57 | 52 | 12 | 78 | 5 |
| 1 | 66 | 27 | 28 | 53 | 87 | 79 | 102 |
| 2 | 44 | 28 | 16 | 54 | 65 | 80 | 76 |
| 3 | 22 | 29 | 95 | 55 | 43 | 81 | 48 |
| 4 | 0 | 30 | 77 | 56 | 21 | 82 | 31 |
| 5 | 92 | 31 | 61 | 57 | 71 | 83 | 18 |
| 6 | 82 | 32 | 34 | 58 | 45 | 84 | 93 |
| 7 | 64 | 33 | 3 | 59 | 29 | 85 | 68 |
| 8 | 36 | 34 | 85 | 60 | 15 | 86 | 56 |
| 9 | 6 | 35 | 53 | 61 | 75 | 87 | 33 |
| 10 | 89 | 36 | 32 | 62 | 62 | 88 | 17 |
| 11 | 78 | 37 | 4 | 63 | 26 | 89 | 94 |
| 12 | 47 | 38 | 103 | 64 | 19 | 90 | 70 |
| 13 | 39 | 39 | 83 | 65 | 100 | 91 | 63 |
| 14 | 2 | 40 | 46 | 66 | 74 | 92 | 40 |
| 15 | 97 | 41 | 25 | 67 | 51 | 93 | 10 |
| 16 | 79 | 42 | 11 | 68 | 27 | 94 | 99 |
| 17 | 58 | 43 | 98 | 69 | 1 | 95 | 81 |
| 18 | 38 | 44 | 72 | 70 | 80 | 96 | 49 |
| 19 | 20 | 45 | 60 | 71 | 50 | 97 | 30 |
| 20 | 91 | 46 | 35 | 72 | 42 | 98 | 7 |
| 21 | 73 | 47 | 14 | 73 | 13 | 99 | 101 |
| 22 | 59 | 48 | 96 | 74 | 90 | 100 | 84 |
| 23 | 23 | 49 | 69 | 75 | 67 | 101 | 54 |
| 24 | 8 | 50 | 55 | 76 | 52 | 102 | 41 |
| 25 | 86 | 51 | 24 | 77 | 37 | 103 | 9 |

FIG.3A

TABLE 2

| k | LINEAR ORDER | | INTERLEAVED ORDER | |
|---|---|---|---|---|
| | F(k) | F(52+k) | F(T(k)) | F(T(52+k)) |
| 0 | 0 | 1 | 0 | 1 |
| 1 | 0 | 1 | 1 | 0 |
| 2 | 0 | 1 | 1 | 0 |
| 3 | 0 | 1 | 0 | 1 |
| 4 | 1 | 0 | 0 | 1 |
| 5 | 0 | 1 | 0 | 0 |
| 6 | 0 | 1 | 1 | 0 |
| 7 | 0 | 1 | 0 | 1 |
| 8 | 0 | 1 | 1 | 0 |
| 9 | 1 | 0 | 0 | 1 |
| 10 | 1 | 0 | 1 | 0 |
| 11 | 1 | 0 | 1 | 0 |
| 12 | 1 | 0 | 1 | 0 |
| 13 | 1 | 0 | 1 | 0 |
| 14 | 0 | 1 | 0 | 1 |
| 15 | 0 | 1 | 1 | 0 |
| 16 | 0 | 1 | 1 | 0 |
| 17 | 1 | 0 | 1 | 0 |
| 18 | 1 | 0 | 1 | 0 |
| 19 | 0 | 1 | 0 | 1 |
| 20 | 0 | 1 | 0 | 1 |
| 21 | 1 | 0 | 0 | 1 |
| 22 | 0 | 1 | 1 | 0 |
| 23 | 0 | 1 | 0 | 1 |
| 24 | 0 | 1 | 0 | 1 |
| 25 | 0 | 1 | 1 | 0 |
| 26 | 0 | 1 | 1 | 0 |
| 27 | 0 | 1 | 1 | 0 |

FIG.3B-1

| | | | | |
|---|---|---|---|---|
| 28 | 1 | 0 | 0 | 1 |
| 29 | 1 | 0 | 0 | 1 |
| 30 | 0 | 1 | 1 | 0 |
| 31 | 0 | 1 | 0 | 1 |
| 32 | 0 | 1 | 0 | 1 |
| 33 | 0 | 1 | 0 | 1 |
| 34 | 0 | 1 | 1 | 0 |
| 35 | 1 | 0 | 1 | 0 |
| 36 | 1 | 0 | 0 | 1 |
| 37 | 0 | 1 | 1 | 0 |
| 38 | 1 | 0 | 1 | 0 |
| 39 | 1 | 0 | 1 | 0 |
| 40 | 1 | 0 | 0 | 1 |
| 41 | 0 | 1 | 0 | 1 |
| 42 | 1 | 0 | 1 | 0 |
| 43 | 1 | 0 | 1 | 0 |
| 44 | 1 | 0 | 1 | 0 |
| 45 | 0 | 1 | 1 | 0 |
| 46 | 0 | 1 | 1 | 0 |
| 47 | 1 | 0 | 0 | 1 |
| 48 | 1 | 0 | 0 | 1 |
| 49 | 0 | 1 | 0 | 1 |
| 50 | 1 | 0 | 1 | 0 |
| 51 | 0 | 1 | 0 | 1 |

FIG.3B-2

| FIG.3B-1 |
|---|
| FIG.3B-2 |

FIG.3B

TABLE 3

| k | LINEAR ADDRESS ORDER | | | | | INTERLEAVED ADDRESS ORDER | | | | |
|---|---|---|---|---|---|---|---|---|---|---|
| | 0 | 1 | 2 | 3 | | 0 | 1 | 2 | 3 | |
| | F(k) | F(52+k) | F(26+k) | F(78+k) | BNL(k) | F AT T(k) | F AT T(52+k) | F AT T(26+k) | F AT T(78+k) | BNL(k) |
| 0 | 0 | 1 | 2 | 3 | 0 | 2 | 1 | 3 | 0 | 6 |
| 1 | 0 | 3 | 2 | 1 | 8 | 1 | 2 | 3 | 0 | 7 |
| 2 | 2 | 1 | 3 | 0 | 6 | 3 | 0 | 2 | 1 | 9 |
| 3 | 0 | 3 | 1 | 2 | 10 | 2 | 1 | 0 | 3 | 4 |
| 4 | 1 | 2 | 0 | 3 | 5 | 2 | 3 | 3 | 2 | 2 |
| 5 | 0 | 3 | 2 | 1 | 8 | 3 | 0 | 0 | 1 | 12 |
| 6 | 0 | 1 | 2 | 3 | 0 | 2 | 1 | 2 | 1 | 9 |
| 7 | 0 | 1 | 2 | 3 | 0 | 1 | 0 | 0 | 3 | 4 |
| 8 | 0 | 1 | 3 | 2 | 0 | 0 | 1 | 3 | 2 | 3 |
| 9 | 1 | 0 | 1 | 2 | 3 | 1 | 0 | 2 | 2 | 2 |
| 10 | 3 | 0 | 0 | 1 | 11 | 3 | 2 | 1 | 3 | 1 |
| 11 | 3 | 2 | 3 | 0 | 13 | 3 | 2 | 1 | 0 | 15 |
| 12 | 1 | 2 | 3 | 0 | 7 | 3 | 2 | 1 | 0 | 15 |

FIG.3C-1

| | | | | | | | | | | |
|---|---|---|---|---|---|---|---|---|---|---|
| 13 | 1 | 0 | 3 | 2 | 3 | 3 | 0 | 1 | 2 | 11 |
| 14 | 0 | 1 | 3 | 2 | 2 | 2 | 1 | 0 | 3 | 4 |
| 15 | 0 | 3 | 2 | 1 | 8 | 1 | 2 | 0 | 3 | 5 |
| 16 | 2 | 3 | 1 | 0 | 14 | 1 | 2 | 3 | 0 | 7 |
| 17 | 3 | 2 | 1 | 0 | 15 | 1 | 0 | 3 | 2 | 3 |
| 18 | 1 | 0 | 3 | 2 | 3 | 3 | 0 | 1 | 2 | 11 |
| 19 | 2 | 3 | 0 | 1 | 12 | 2 | 3 | 1 | 0 | 14 |
| 20 | 2 | 1 | 0 | 3 | 4 | 2 | 1 | 3 | 0 | 6 |
| 21 | 1 | 2 | 3 | 0 | 7 | 2 | 1 | 0 | 3 | 4 |
| 22 | 2 | 1 | 3 | 0 | 6 | 1 | 0 | 2 | 3 | 1 |
| 23 | 0 | 1 | 2 | 3 | 0 | 0 | 3 | 2 | 1 | 8 |
| 24 | 2 | 1 | 3 | 0 | 6 | 0 | 1 | 3 | 2 | 2 |
| 25 | 0 | 3 | 2 | 1 | 8 | 3 | 0 | 2 | 1 | 9 |

FIG.3C-2

| FIG.3C-1 |
|---|
| FIG.3C-2 |

FIG.3C

TABLE 4

| k | 0 | 1 | 2 | 3 | 4 | 5 | 6 | 7 | |
|---|---|---|---|---|---|---|---|---|---|
| | F(k) | F(52+k) | F(26+k) | F(78+k) | F(13+k) | F(65+k) | F(39+k) | F(91+k) | BNL(k) |
| 0 | 0 | 1 | 2 | 3 | 5 | 4 | 7 | 6 | 12 |
| 1 | 4 | 3 | 6 | 5 | 0 | 1 | 7 | 2 | 1864 |
| 2 | 2 | 1 | 3 | 0 | 4 | 7 | 6 | 5 | 146 |
| 3 | 4 | 7 | 1 | 6 | 2 | 3 | 5 | 0 | 3050 |
| 4 | 5 | 2 | 0 | 7 | 3 | 6 | 1 | 4 | 3261 |
| 5 | 4 | 3 | 2 | 5 | 1 | 0 | 7 | 6 | 1356 |
| 6 | 0 | 1 | 2 | 7 | 6 | 3 | 4 | 5 | 2208 |
| 7 | 0 | 1 | 2 | 3 | 5 | 6 | 4 | 7 | 32 |
| 8 | 4 | 1 | 7 | 3 | 2 | 5 | 7 | 0 | 300 |
| 9 | 1 | 4 | 1 | 6 | 4 | 5 | 3 | 0 | 2859 |
| 10 | 3 | 0 | 4 | 2 | 2 | 5 | 6 | 7 | 67 |
| 11 | 7 | 6 | 7 | 5 | 2 | 1 | 3 | 0 | 3961 |
| 12 | 1 | 2 | 7 | 4 | 0 | 3 | 6 | 5 | 2451 |

LINEAR ACCESS ORDER

FIG.3D

TABLE 5

INTERLEAVED ACCESS ORDER

| k | 0<br>F AT<br>T(k) | 1<br>F AT<br>T(52+k) | 2<br>F AT<br>T(26+k) | 3<br>F AT<br>T(78+k) | 4<br>F AT<br>T(13+k) | 5<br>F AT<br>T(65+k) | 6<br>F AT<br>T(39+k) | 7<br>F AT<br>T(91+k) | BNL(k) |
|---|---|---|---|---|---|---|---|---|---|
| 0 | 2 | 1 | 3 | 4 | 7 | 0 | 5 | 6 | 414 |
| 1 | 1 | 6 | 3 | 0 | 2 | 5 | 4 | 7 | 563 |
| 2 | 7 | 4 | 2 | 1 | 5 | 6 | 0 | 3 | 2405 |
| 3 | 2 | 1 | 4 | 3 | 5 | 6 | 7 | 0 | 316 |
| 4 | 0 | 5 | 3 | 2 | 1 | 4 | 7 | 6 | 1038 |
| 5 | 2 | 3 | 4 | 1 | 5 | 0 | 5 | 6 | 476 |
| 6 | 7 | 4 | 2 | 3 | 5 | 3 | 1 | 0 | 3561 |
| 7 | 2 | 1 | 4 | 2 | 6 | 5 | 7 | 0 | 312 |
| 8 | 1 | 4 | 3 | 2 | 6 | 5 | 0 | 7 | 291 |
| 9 | 0 | 5 | 3 | 3 | 1 | 4 | 6 | 7 | 1030 |
| 10 | 5 | 0 | 2 | 0 | 4 | 7 | 6 | 1 | 1153 |
| 11 | 3 | 2 | 5 | 0 | 4 | 1 | 7 | 6 | 1115 |
| 12 | 7 | 6 | 5 | 0 | 3 | 4 | 2 | 1 | 3799 |

FIG.3E

| ACCESS TYPE | OUTPUT PINS | OUTPUT PINS BY F | |
|---|---|---|---|
| 2-TUPLE | | LINEAR ADDRESS | INTERLEAVED ADDRESS |
| $a_0(k)$ | 0 | $F_{k0} = F(a_0(k))$ | $F_{Tk0} = F(T(a_0(k)))$ |
| $a_1(k)$ | 1 | $F_{k1} = F(a_1(k))$ | $F_{Tk1} = F(T(a_1(k)))$ |
| 4-TUPLE | | | |
| $a_0(k)$ | 0 | $F_{k0} = F(a_0(k))$ | $F_{Tk0} = F(T(a_0(k)))$ |
| $a_1(k)$ | 1 | $F_{k1} = F(a_1(k))$ | $F_{Tk1} = F(T(a_1(k)))$ |
| $a_2(k)$ | 2 | $F_{k2} = F(a_2(k))$ | $F_{Tk2} = F(T(a_2(k)))$ |
| $a_3(k)$ | 3 | $F_{k3} = F(a_3(k))$ | $F_{Tk3} = F(T(a_3(k)))$ |
| 8-TUPLE | | | |
| $a_0(k)$ | 0 | $F_{k0} = F(a_0(k))$ | $F_{Tk0} = F(T(a_0(k)))$ |
| $a_1(k)$ | 1 | $F_{k1} = F(a_1(k))$ | $F_{Tk1} = F(T(a_1(k)))$ |
| $a_2(k)$ | 2 | $F_{k2} = F(a_2(k))$ | $F_{Tk2} = F(T(a_2(k)))$ |
| $a_3(k)$ | 3 | $F_{k3} = F(a_3(k))$ | $F_{Tk3} = F(T(a_3(k)))$ |
| $a_4(k)$ | 4 | $F_{k4} = F(a_4(k))$ | $F_{Tk4} = F(T(a_4(k)))$ |
| $a_5(k)$ | 5 | $F_{k5} = F(a_5(k))$ | $F_{Tk5} = F(T(a_5(k)))$ |
| $a_6(k)$ | 6 | $F_{k6} = F(a_6(k))$ | $F_{Tk6} = F(T(a_6(k)))$ |
| $a_7(k)$ | 7 | $F_{k7} = F(a_7(k))$ | $F_{Tk7} = F(T(a_7(k)))$ |

FIG.8

| INPUT | OUTPUT | $X_3$ | $X_2$ | $X_1$ | $X_0$ |
|---|---|---|---|---|---|
| 00 | 00 | · | 0 | · | 0 |
|  | 01 | 0 | · | · | 1 |
|  | 10 | · | 1 | · | 0 |
|  | 11 | 1 | · | · | 1 |
| 01 | 00 | · | 0 | · | 1 |
|  | 01 | 0 | · | · | 0 |
|  | 10 | · | 1 | · | 1 |
|  | 11 | 1 | · | · | 0 |
| 10 | 00 | · | · | 1 | 0 |
|  | 01 | 1 | · | 1 | · |
|  | 10 | · | 0 | 0 | · |
|  | 11 | 0 | · | 1 | · |
| 11 | 00 | · | · | 1 | 1 |
|  | 01 | 1 | · | 0 | · |
|  | 10 | · | 0 | 1 | · |
|  | 11 | 0 | · | 0 | · |

FIG. 12

| | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| $X_0$ | 0 | 1 | 0 | 1 | 0 | 1 | 0 | 1 | 1 | 0 | 1 | 0 | 1 | 0 | 1 | 0 |
| $X_1$ | | | | | | | | | | | | | | | | |
| $X_2$ | | | | | | | | | | | | | | | | |
| $X_3$ | | | | | | | | | | | | | | | | |
| $X_4$ | 0 | | 1 | | 0 | | 1 | | 0 | | 1 | | 0 | | 1 | |
| $X_5$ | | | | | | | | | | | | | | | | |
| $X_6$ | | 0 | | 1 | | 0 | | 1 | | 0 | | 1 | | 0 | | 1 |
| $X_7$ | | | | | | | | | | | | | | | | |
| $X_8$ | 0 | | | | 1 | | | | 0 | | | | 1 | | | |
| $X_9$ | | | 0 | | | | 1 | | | | 0 | | | | 1 | |
| $X_{10}$ | | 0 | | | | 1 | | | | 0 | | | | 1 | | |
| $X_{11}$ | | | | 0 | | | | 1 | | | | 0 | | | | 1 |
| nXFn | 000 | 001 | 010 | 011 | 100 | 101 | 110 | 111 | 001 | 000 | 011 | 010 | 101 | 100 | 111 | 110 |
| Fn | 000 | 001 | 010 | 011 | 100 | 101 | 110 | 111 | 000 | 001 | 010 | 011 | 100 | 101 | 110 | 111 |
| n | 0 | 0 | 0 | 0 | 0 | 0 | 0 | 0 | 1 | 1 | 1 | 1 | 1 | 1 | 1 | 1 |

MULTIPLE ACCESS FOR PARALLEL TURBO DECODER

TECHNICAL FIELD

The exemplary and non-limiting embodiments of this invention relate generally to wireless communication systems, methods, devices and computer program products and, more specifically, relate to techniques for decoding channel codes used for forward error correction.

BACKGROUND

During operation of a wireless communication system when transmitting data it is necessary to decode various channel codes that are used for forward error correction. Typical channel codes, such as those used in 3G systems and WiMAX, are turbo codes, duo-turbo codes, and low density parity check (LDPC) codes.

Higher transmitted data rates imply the presence of a faster channel decoder at a receiver. A simple solution to address this need is to increase a clock frequency of a receiver decoder to achieve a required data rate. However, the use of a high clock frequency requires the decoder, such as one implemented in an integrated circuit such as an ASIC, to consume more power which, in a portable battery powered device, is a distinct disadvantage.

Another possible solution is to apply parallel processing for decoding. However, this approach raises a problem related to multiple access of data in two different access orders. While it may be straightforward to design a multiple access scheme for one access order, in the case of turbo codes and low density parity check codes, the multiple access scheme must be usable at least for two independent access orders without an access collision.

One possible technique to address the multiple access problem is to implement a row or bank of turbo decoders without internal multiple access capability. This technique may be adequate when data rates are not high, e.g., less than 20, Mbps.

Another possible technique to establish parallel processing is to design an interleaver of a code such that the interleaver supports some kind of multiple access schemes. An example of this kind approach is described by Takeshita, "On maximum contention-free interleavers and permutation polynomials over integer rings", IEEE Trans. Inform. Theory, vol. 52, no. 3, pp. 1249-1253, March 2006. A weakness of this technique is that it is not applicable to existing systems. Another weakness is that a type of parallel processing depends on an interleaver of a code and one cannot modify it afterwards Yet another multiple access technique is described by Benedetto et al., "Design issues on the parallel implementation of versatile, high-speed iterative decoders", Turbo-Coding-2006, Apr. 3-7, 2006, Munich. Reference can also be had to an approach described by Tarable et al., "Mapping Interleaving Laws to Parallel Turbo and LDPC Decoder Architectures", IEEE Transactions on Information Theory, Vol. 50, No. 9, September 2004.

Tarable et al. construct a mapping such that it is possible to process data in parallel both in a linear order and in an interleaved order without an access collision. Moreover, their solution is independent of the interleaver, that is, their method can be applied to any interleaver without restrictions. However, a drawback to this approach is that it requires very large switches (multiplexers) for implementation. Another drawback is that the method must be able to reorder data from any order to any order. For example, to accomplish parallel processing of degree 4, the decoder needs to generate $4!=1*2*3*4=24$, orders. If the degree of parallel processing is 8, there are $8!=40320$, cases to generate.

Clearly, a deficiency of this approach is that the algorithm used to generate the mapping function is quite complex. Also the algorithm does not guarantee a simple network for routing data.

SUMMARY

The foregoing and other problems are overcome, and other advantages are realized, in accordance with the non-limiting and exemplary embodiments of this invention.

In accordance with one embodiment of the invention is a method. A memory bank is provided that includes of a plurality of memories, a first Butterfly network is provided that is configured to apply memory addresses to the memory bank, and a second Butterfly network is provided that is configured to pass data to or from the memory bank. Further in the method, a control signal is generated for the first and second Butterfly networks in accordance with a multiple access rule to enable parallel access to the memory bank, without memory access conflict, for one of a linear order and an interleaved order.

In accordance with another embodiment of the invention is a program of machine-readable instructions, embodied on a tangible memory and executable by a digital data processor, to perform actions directed toward controlling memory access. In this embodiment, the actions include generating a control signal for a first Butterfly network and for a second Butterfly network in accordance with a multiple access rule to enable parallel access to a memory bank, without memory access conflict, for one of a linear order and an interleaved order, and sending the control signal to the first and second Butterfly networks. The memory bank includes a plurality of memories, the first Butterfly network is configured to apply memory addresses to the memory bank, and the second Butterfly network is configured to pass data to or from the memory bank.

In accordance with another embodiment of the invention is an apparatus that includes a memory bank that has a plurality of memories, a first and a second Butterfly network, and a processor. The first Butterfly network is coupled to the memory bank, and is configured to apply memory addresses to the memory bank. The second Butterfly network is coupled to the memory bank, and is configured to pass data to or from the memory bank. The processor has a control output coupled to the first and to the second Butterfly networks, and is configured to generate a control signal for the first and second Butterfly networks in accordance with a multiple access rule to enable parallel access to the memory bank, without memory access conflict, for one of a linear order and an interleaved order.

BRIEF DESCRIPTION OF THE DRAWINGS

The foregoing and other aspects of the teachings of this invention are made more evident in the following Detailed Description, when read in conjunction with the attached Drawing Figures.

FIGS. 3A-E are tables showing values of multiple access functions and access orders according to detailed examples described herein.

FIG. 8 is a table showing notations for input pins and output pins of switches in various n-tuple butterfly networks.

FIG. 12 is a table showing three-bit control signals to the switches of FIG. 11 for all allowed transitions from input pins 0 and 1.

DETAILED DESCRIPTION

Certain turbo decoders used for 3G mobile devices (e.g., cdma2000, WCDMA) use 22, cycles per bit for decoding turbo coded data during ten rounds. Using the multiple access rule of order 2, 4, and 8, the cycle efficiency is about 11, 5.5, and 2.75, cycles per bit at 10 rounds, respectively. The exemplary embodiments of this invention provide an ability to design high speed turbo decoders for use with higher data rates, such as those expected for future communication standards, with reasonably low power consumption. Embodiments of this invention may be employed in networks that operate, for example, using 3G, WiMAX, LTE (long term evolution of UTRAN or 3.9G), HSDPA/HSUPA (high speed downlink/uplink packet access), and other wireless protocols. Embodiments of this invention are not limited to a particular wireless protocol, and may be employed in mobile devices/user equipment and/or network elements such as base stations/Node B's and the like.

Certain prior art approaches were summarized in the background section above. As opposed to the technique of Takeshita cited above, embodiments of this invention provide a solution that allows several different types of parallel processing schemes for a given interleaver. The algorithms of Benedetto et al. and Tarable et al. to construct a mapping function are general. For example, their algorithm can be applied when a degree of parallel processing is five. Embodiments of the invention detailed below require that a degree of parallel processing is a power of 2: 2, 4, 8, and so on. This results from different underlying approaches to the problem, and so embodiments of this invention do not require the large multiplexers or computational load noted above for the approaches of Benedetto et al. and Tarable et al.

The exemplary embodiments of this invention provide in one aspect thereof an explicit algorithm and method to construct a function F from an address space for a set of memories such that data can be accessed in parallel in two independent orders without an access conflict. The function F associates each address to one memory. Furthermore, the function F provides a control signal for a butterfly network for implementing multiple accesses.

Figure 1:
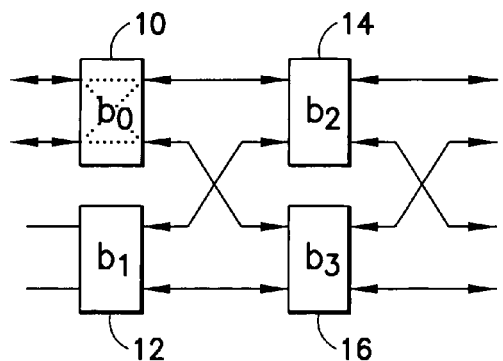
FIG. 1 depicts an exemplary Butterfly network with four buses.
Figure 2:
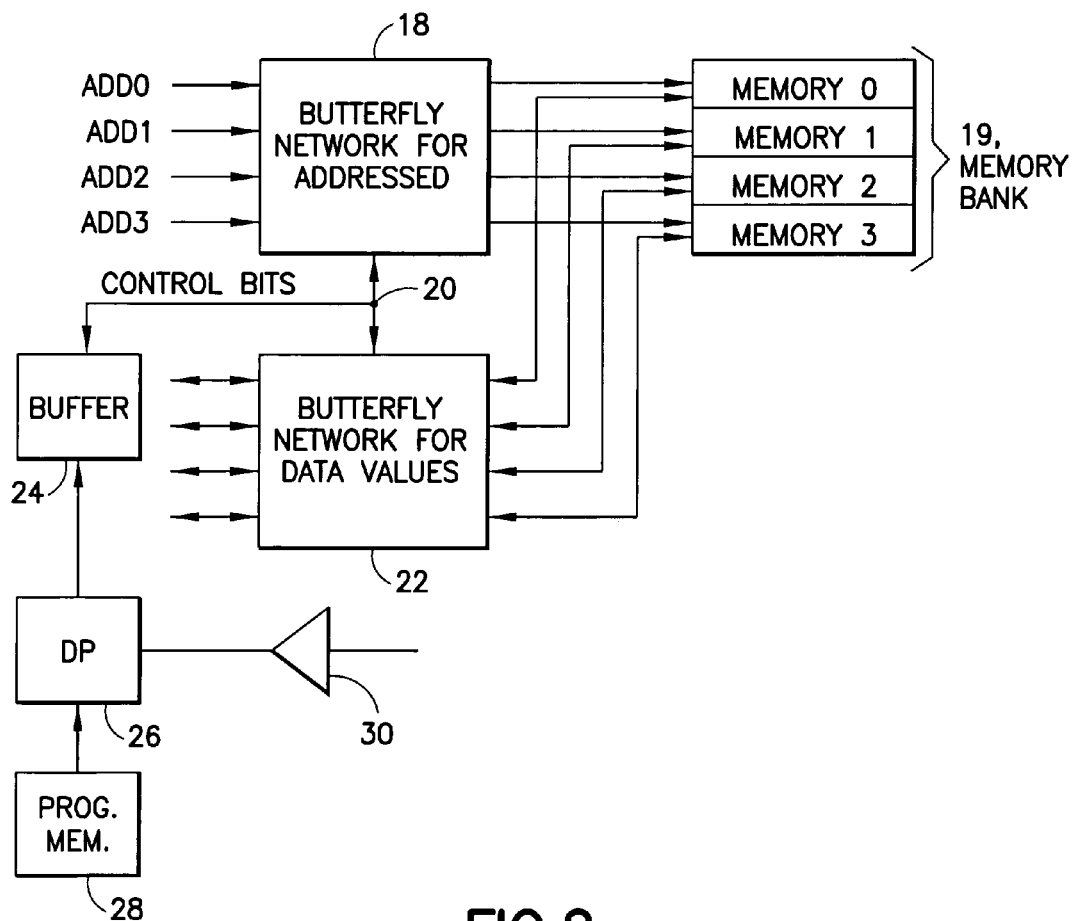
FIG. 2 illustrates a memory bank coupled with the two Butterfly networks to implement parallel processing of degree four, and a data a processor operable for generating a control signal for the Butterfly networks in accordance with the exemplary embodiments of this invention.

Prior to describing the exemplary embodiments of this invention in further detail reference can be made to FIGS. 1 and 2 for showing circuitry operable with one exemplary and non-limiting turbo decoder architecture, and that can be used with the exemplary embodiments.

Note first that it is well known that a Benes network is able to generate all orders given by a factorial of a number. However, a weakness of a Benes network is that calculation of control bits for the Benes network is a very complex task.

In the embodiments shown in FIGS. 1 and 2 a Butterfly network is applied to parallel turbo decoding as a data router. While a Butterfly network cannot generate as many orders as a Benes network, the number of orders generated is sufficient to establish parallel processing for the orders of turbo decoding that are of interest.

FIG. 1 illustrates a Butterfly network of four buses. The Butterfly network contains four switches 10, 12, 14 and 16. Each switch is capable of creating a straight connection ($b_0=0$) or a cross connection ($b_0=1$). The control signal of this exemplary Butterfly network is 4-bits: ($b_3$, $b_2$, $b_1$, $b_0$). Data can pass through the Butterfly network from left to right or from right to left.

Referring to FIG. 2, and by example, if the degree of parallel processing is 4, then a first (address) Butterfly network 18 receives as inputs in order to access a bank 19 of four memories (Memory_, 0, Memory_, 1, Memory_, 2, Memory_, 3): a set of control bits 20 (4, bits, e.g., $b_3$, $b_2$, $b_1$, $b_0$); and four addresses: add0, add1, add2, add3. The four addresses pass through the Butterfly network 18 and are applied to the memory bank 19 connected to output pins of the Butterfly network 18. Four data values are read in parallel from the memory bank 19 (one from each memory Memory_, 0, Memory_, 1, Memory_, 2, Memory_, 3) and routed to a second (data) Butterfly network 22 in the same manner as the four addresses, but in a reverse direction. The four addresses may be generated either in a linear order or in an interleaved order. The control bits 20 are order and position specific, and are generated in accordance with the exemplary embodiments of this invention, as discussed below.

Writing to the memory bank 19 is similar to reading, where the control bits 20, 4 write addresses, and 4, data values are fed to the address Butterfly network 18 and to the data Butterfly network 22.

The bits of the control signal 20 can be generated in a linear order and an interleaved order. The bits of the control signal 20 may be generated before decoding begins and stored into an auxiliary memory buffer 24. For example, the same butterfly network can be used to store data in the memories and/or retrieve data from the memories in a linear order using one set of control bits, and in an interleaved order using another set of control bits. Both sets of control bits are the same width for a given degree of parallelism. Control signals for a 2-tuple butterfly network are one bit wide, control signals for a 4-tuple butterfly network are four bits wide, and control signals for an 8-tuple butterfly network are twelve bits wide. In general, a $2^m$-tuple butterfly network requires an $m*2^{m-1}$-bit wide control signal.

The illustrated embodiments are well suited for use in, but not limited to, parallel degree of 2, 4, and 8, for WCDMA turbo codes. Note that the parallel processing made possible by the use of the Butterfly networks 18 and 22 is independent of any system interleavers.

In a more generic description, a multiple access function for allowing two parallel accesses for a linear order and an interleaved order is generated for n-tuples with $n=2^m$. The total length of an address space of a memory bank like in FIG. 2 is denoted by N. The length of a component memory of the memory bank is N/n. An interleaver over the address space $\{0, 1, 2, \ldots, N-1\}$ is denoted by T and its inverse interleaver by $T^{-1}$. An inverse of an interleaver is called a deinterleaver. A multiple access function from the address space $\{0, 1, 2, \ldots, N-1\}$ to the component memory space $\{0, 1, 2, \ldots, n-1\}$ is denoted by F. A data value having an address $k=0, 1, 2, \ldots, N-1$, is in a component memory $F(k)$ of the memory bank.

In the linear order data has n-tuple access $P_n(k)=\{a_0(k), a_1(k), a_2(k), \ldots, a_{n-1}(k)\}$ for $k=0, 1, 2, \ldots N/n-1$, where the component functions $a_j(k)$ describe which addresses are applied in parallel at a time and N stands for a length of an address space. It is assumed that values of the component functions $a_j$, shall differ from each other, that is, $a_i(r) \neq a_j(k)$ for $i \neq j$ and for all r and k in the index space $\{0, 1, 2, \ldots, N/n-1\}$. In the interleaved order data has other n-tuple access via the interleaver T: $\{T(a_0(k)), T(a_1(k)), T(a_2(k)), \ldots, T(a_{n-1}(k))\}$. In order to make butterfly networks feasible and useful for parallel accesses defined for two different access orders one has to find a multiple access function F meeting the following requirements:

(i) $F(a_i(k)) \neq F(a_j(k))$ for $i \neq j$ and for all $k=0, 1, 2, \ldots, N/n-1$, (linear order).
(ii) $F(T(a_i(k))) \neq F(T(a_j(k)))$ for $i \neq j$ and for all $k=0, 1, 2, \ldots, N/n-1$, (interleaved order).
(iii) The function F generates control bits for the butterfly network of degree $n=2^m$, for a linear order and an interleaved order.

Multiple access schemes based on $2^m$-tuple butterfly networks can be designed from lower degree $2^{m-1}$-tuples iteratively. So 4-tuple multiple access schemes are derived from their 2-tuple counter parts and the process can be applied more generically. A design procedure begins with 1-tuples, that is, by accessing one data value at a time. It follows from the design procedure that an obtained multiple access function F agrees with permutations of a butterfly network.

Next the degree of parallel processing is 2, and the rule of parallel processing is defined as $P_2(k)=\{a_0(k), a_1(k)\}$ for $k=0, 1, 2, \ldots N/2-1$, N stands for a length of a memory and its interleaved parallel counter access is $\{T(a_0(k)), T(a_1(k))\}$; and the function F from an address space $0, 1, 2, \ldots, N-1$, to two memories 0 and 1 has initial values $F(j)=0$, for $j=0, 1, 2, \ldots, N-1$. In other words, at the beginning it is assumed that all data stay in the memory 0. The following algorithm replaces half of zeros by ones.

---
Algorithm I
---
assign k = 0;
Repeat
  If $F(a_0(k)) = 0$ and $F(a_1(k)) = 0$ then
    start = $a_1(k)$;
    j = $a_1(k)$;
    Repeat
      assign F(j) = 1;
      If $T^{-1}(j) = a_0(n)$ for some n then ---
Algorithm I -continued
---
        a = $a_1(n)$;
      else
        a = $a_0(n)$;
      endif
      if $T(a) = a_0(m)$ for some m then
        next j = $a_1(m)$;
      else
        next j = $a_0(m)$;
      endif
      j = next j
    Until j = start;
  endif
  k = next k;
Until all k's have been treated.

---

The broad concept of the algorithm above is to move back and forth between a linear address space and an interleaved address space. A rule to move from a linear address space to an interleaved address space is based on the fact that $m=T(T^{-1}(m))=T(k)$ with $k=T^{-1}(m)$. A rule to move from an interleaved address space to a linear space is $T(a)=b$. In both address spaces the component functions of a parallel access rule $a_0(k)$ and $a_1(k)$ are applied to move from an address to its parallel pair address. That is, a linear address space from $a_0(k)$ to $a_1(k)$ or from $a_1(k)$ to $a_0(k)$ and in an interleaved address space from $T(a_0(k))$ to $T(a_1(k))$ or from $T(a_1(k))$ to $T(a_0(k))$.

After executing the above algorithm it holds that $F(a_0(k))$ is not equal to $F(a_1(k))$ and $F(T(a_0(k)))$ is not equal to $F(T(a_1(k)))$ for all k, where the range of k depends on the parallel access rule, for example, $k=0, 1, 2, \ldots, N/2-1$. It thus follows that one may process data with two parallel accesses in the linear order, and in the interleaver order, without memory access conflict. A data value having an address j is in a memory $F(j)$. Moreover, a 2-tuple butterfly network can be used to route data to and from the two memories. Control bits for the butterfly network on a linear address space are $F(a_0(k))$. In the case of an interleaved address space, control bits for the butterfly network are $F(T(a_0(k)))$.

The 2-tuple parallel access rule $P_2$, can be constructed in several ways. Three non-limiting examples include:
divide the address space into odd and even addresses: $a_0(k)$ runs thru all even addresses and $a_1(k)$ does all odd addresses, that is, $a_0(k)=2*k$ and $a_1(k)=2*k+1$;
as an alternative, data is processed from the beginning and end: $a_0(k)=k$ and $a_1(k)=N-1-k$ for $k=0, 1, 2, \ldots, N/2-1$;
alternatively, processing of data proceeds from the beginning and the middle: $a_0(k)=k$ and $a_1(k)=N/2+k$ for $k=0, 1, 2, \ldots N/2-1$.

Higher degree parallel processing is derived from its lower degree counterpart by dividing each sub address space again into two sets. For example, a multiple access function for 4-tuples is derived from a multiple access function for 2-tuples. The idea of constructions is to split both address memory spaces into two in order to obtain four new address memory spaces. Addresses for a memory 0 are split into two sets of addresses by associating them with memories 0 and 2. Likewise addresses for a memory 1 are split into two sets of addresses by reallocating them with memories 1 and 3. To do this one has to define a rule how to form pairs of 2-tuples. To this end, define a 2-tuple parallel access rule as $P_2(k)=\{a_0(k), a_1(k)\}$ for $k=0, 1, 2, \ldots N/2-1$. Then we need a function that associates all 2-tuples as pairs to form 4-tuples for parallel access. Define the pair function $q_2(k)=\{b_0(k), b_1(k)\}$ with $b_0(k) \neq b_1(k)$ for $k=1, 2, 3, \ldots, N/4-1$. Finally we define a 4-tuple function $P_4$, by $P_4(k)=\{P_2(b_0(k)), P_2(b_1(k))\}$ for $k=1, 2, 3, \ldots, N/4-1$. It follows that $$P_4(k) = \{P_2(b_0(k)), P_2(b_1(k))\}$$
$$= \{a_0(b_0(k)), a_1(b_0(k)), a_0(b_1(k)), a_1(b_1(k))\}$$
$$= \{c_0(k), c_1(k), c_2(k), c_3(k)\}.$$

The function $P_4$, describes a 4-tuple parallel access rule.

The parallel rule $P_4$, can be constructed in several ways. Three non-limiting examples include:

- divide the address space into the four remainders of four: 0, 1, 2, and 3. Then four consecutive data values are processed in parallel access. In this case: $P_4(k)=(4k, 4k+1, 4k+2, 4k+3)$ for $k=1, 2, 3, \ldots, N/4-1$. So $c_0(k)=4*k$, $c_1(k)=4*k+1$, $c_2(k)=4*k+2$, and $c_3(k)=4*k+3$.
- as an alternative, data is processed from the beginning and end such that two data values from both at a time: $c_0(k)=2*k$, $c_1(k)=N-1-2*k$, $c_2(k)=2*k+1$, and $c_3(k)=N-2-2*k$ for $k=0, 1, 2, \ldots, N/4-1$, that is, $P_4(k)=(2*k, N-1-2*k, 2*k+1, N-2-2*k)$;
- alternatively, processing of data proceeds over four equal size windows of a data frame: $c_0(k)=k$, $c_1(k)=N/4+k$, $c_2(k)=N/2+k$, and $c_3(k)=3*N/4+k$ for $k=0, 1, 2, \ldots N/4-1$, in other words, $P_4(k)=(k, N/4+k, N/2+k, 3*N/4+k)$;

The algorithm below shows how the address memory space for memory 0 is split into two address memory spaces memory 0 and memory 2. The address memory space for memory 1 is treated in the same way by assigning old=1, and new=3, before executing the algorithm.

---

Algorithm II

```
assign old = 0;
assign new = 2;
assign k = 0;
Repeat
    If (F(c_0(k)) = old or F(c_1(k)) = old) and
       (F(c_2(k)) = old or F(c_3(k)) = old) then
        start = c_2(k);
        j = c_2(k);
        m = k;
        p = 2;
        Repeat
            If(F(j) ≠old) then
                j = c_{p+1}(m);
            endif
            assign F(j) = new;
            If (T^{-1} (j) = c_i(n) for some n) and
               (i<2 for some i) then
                a = c_2(n);
                index = 2;
            else
                a = c_0(n);
                index = 0;
            endif
            If (F(T(a)) ≠old) then
                a = c_{index+1}(n);
            endif
            if (T(a) = c_t(m) for some m) and
               (t<2 for some t) then
                next j = c_2(m);
                p = 2;
            else
                next j = c_0(m);
                p = 0;
            endif
            j = next j
        Until j = start;
    endif
    k = next k;
Until all k's have been treated from 0 to N/4-1.
```

---

As a summary, the steps to construct a multiple access function F for 4-tuples are:

Execute Algorithm I to obtain a multiple access function F for 2-tuples based on a chosen 2-tuple multiple access rule $P_2(k)=\{a_0(k), a_1(k)\}$ for $k=0, 1, 2, \ldots N/2-1$;

Execute Algorithm II with old =0, and new=2, applying a chosen 4-tuple multiple access rule $P_4(k)=\{c_0(k), c_1(k), c_2(k), c_3(k)\}$ for $k=0, 1, 2, \ldots N/4-1$;

Execute Algorithm II a second time with old =1, and new=3, applying again the same 4-tuple multiple access rule $P_4(k)=\{c_0(k), c_1(k), c_2(k), c_3(k)\}$ for $k=0, 1, 2, \ldots N/4-1$;

Because most cases only one 2-tuple parallel access rule and one 4-tuple parallel access rule are required to be implemented, it is useful to take advantage of the special properties that particular 2-tuple and 4-tuple rules to simplify Algorithms I and II.

Next we illustrate how to construct a multiple access function F for 8-tuple butterfly networks. A multiple access function for 8-tuples is constructed by combining two 4-tuples to one 8-tuples. First we have to determine how 4-tuples are combined to 8-tuples. To this end define the pair function $r_2$, by $r_2(k)=(s_0(k), s_1(k))$ and $s_0(k) \neq s_1(k)$ for $k=0, 1, 2, \ldots, N/8-1$. The 8-tuple multiple access rule function $P_8$, is defined as $P_8(k)=\{P_4(s_0(k)), P_4(s_1(k))\}$ for $k=0, 1, 2, \ldots, N/8-1$. In other words, $$P_8(k) = \{P_4(s_0(k)), P_4(s_1(k))\}$$
$$= \{c_0(s_0(k)), c_1(s_0(k)), c_2(s_0(k)), c_3(s_0(k)), c_0(s_1(k)),$$
$$c_1(s_1(k)), c_2(s_1(k)), c_3(s_1(k))\}$$
$$= \{d_0(k), d_1(k), d_2(k), d_3(k), d_4(k), d_5(k), d_6(k), d_7(k)\}.$$

The function $P_8$, describes an 8-tuple parallel access rule. Hence the function $P_8$, tells which eight addresses are used in parallel. A simple example on $P_8$, is a parallel access rule for eight consecutive data values: $P_8(k)=(8k, 8k+1, 8k+2, 8k+3, 8k+4, 8k+5, 8k+6, 8k+7)$ for $k=0, 1, 2, \ldots, N/8-1$.

A multiple access function F for 4-tuples has four values 0, 1, 2, and 3. A multiple access function F for 8-tuples is derived from a given 4-valued multiple access function by doubling four values as follows: half of addresses associated with 0's are mapped to 4, half of addresses associated with 1's are mapped to 5, half of addresses associated with 2's are mapped to 6, and half of addresses associated with 3's are mapped to 7. The procedure for replacement is similar to that of Algorithm II. The algorithm below changes every other 0 to 4, over 8-tuples on loops of a graph.

---

Algorithm III

```
assign old = 0;
assign new = 4;
assign k = 0;
Repeat
    If (F(d_0(k))=old or F(d_1(k))=old or F(d_2(k))=old or F(d_3(k))=old) and
       (F(d_4(k))=old or F(d_5(k))=old or F(d_6(k))=old or F(d_7(k))=old) then
        start = d_4(k);
        j = d_4(k);
        m = k;
        t = 4;
        Repeat
            While (F(j) ≠old) do
                t = t + 1;
                j = d_t(m);
```

-continued

Algorithm III

```
        endwhile
        assign F(j) = new;
        If (T⁻¹(j) = dᵢ(n) for some n) and (i<4 for some i) then
            a = d₄(n);
            index = 4;
        else
            a = d₀(n);
            index = 0;
        endif
        While (F(T(a)) ≠ old) do
            index = index + 1;
            a = d_{index}(n);
        endwhile
        If (T(a) = dᵣ(m) for some m) and (r<4 for some r) then
            next j = d₄(m);
            t = 4;
        else
            next j = d₀(m);
            t = 0;
        endif
        j = next j;
    Until j = start;
    endif
Until all k's have been treated from 0 to N/8-1;
```

Summary I: As a summary the formal steps to build a multiple access function F for 8-tuple parallel access are:

Execute Algorithm I to obtain a multiple access function F for 2-tuples based on a chosen 2-tuple multiple access rule $P_2(k)=\{a_0(k), a_1(k)\}$ for $k=0, 1, 2, \ldots N/2-1$;

Execute Algorithm II with old =0, and new =2, applying a chosen 4-tuple multiple access rule $P_4(k)=\{c_0(k), c_1(k), c_2(k), c_3(k)\}$ for $k=0, 1, 2, \ldots N/4-1$;

Execute Algorithm II a second time with old =1, and new =3, applying again the same 4-tuple multiple access rule $P_4(k)=\{c_0(k), c_1(k), c_2(k), c_3(k)\}$ for $k=0, 1, 2, \ldots N/4-1$;

Execute Algorithm III a first time with old =0, and new =4, applying a chosen 8-tuple multiple access rule $P_8(k)=\{d_0(k), d_1(k), d_2(k), d_3(k), d_4(k), d_5(k), d_6(k), d_7(k)\}$ for $k=0, 1, 2, \ldots N/8-1$;

Execute Algorithm III a second time with old =1, and new =5, applying again the same 8-tuple multiple access rule $P_8(k)=\{d_0(k), d_1(k), d_2(k), d_3(k), d_4(k), d_5(k), d_6(k), d_7(k)\}$ for $k=0, 1, 2, \ldots N/8-1$;

Execute Algorithm III a third time with old =2, and new =6, applying again the same 8-tuple multiple access rule $P_8(k)=\{d_0(k), d_1(k), d_2(k), d_3(k), d_4(k), d_5(k), d_6(k), d_7(k)\}$ for $k=0, 1, 2, \ldots N/8-1$;

Execute Algorithm III a fourth time with old =3, and new =7, applying once again the same 8-tuple multiple access rule $P_8(k)=\{d_0(k), d_1(k), d_2(k), d_3(k), d_4(k), d_5(k), d_6(k), d_7(k)\}$ for $k=0, 1, 2, \ldots N/8-1$;

After execution of the listed steps the multiple access function F for a 8-tuple parallel access rule satisfies the requirements (i), (ii), and (iii) of Algorithm I with n=8.

In general, a multiple access function for a $2^m$-tuple butterfly network can be designed from a lower degree multiple access function for a $2^{m-1}$-tuple butterfly network iteratively. Half of addresses associated to a sub memory t, where $t=0, 1, 2, \ldots, 2^{m-1}-1$, are reassigned to a new sub memory $(t+2^{m-1})$.

Next three numeric examples are given to illustrate how to apply the invented method to establish both a multiple access function and control bits for butterfly networks for a given parallel access rule. Three parallel accesses are for 2-, 4-, and 8-tuples. A data flame is split into two, four, and eight equal size sub frames that are accesses in parallel as 2-, 4-, and 8-tuples via butterfly networks, respectively. The frame length N is 104, and the interleaver is that of the WCDMA turbo codes having length 104. The values of the 104-bit long WCDMA turbo code interleaver are listed in FIG. 3A/Table 1.

The 2-tuple parallel access rule for two equal size sub frames is defined by $P_2(k)=\{k, N/2+k\}=\{k, 52+k\}$ for $k=0, 1, 2, \ldots, 51$, with N=104. After executing the algorithm of para. [0044] the multiple access function is as in FIG. 3B/Table 2. The control signal for a 2-tuple butterfly network for linear access is F(k) and for interleaved access F(T(k)) for $k=0, 1, 2, \ldots, 51$. FIG. 3B/Table 2, shows that $F(k) \neq F(52+k)$ for linear access and $F(T(k)) \neq F(T(52+k))$ for interleaved access for $k=0, 1, 2, \ldots, 51$. Hence two memories can be accessed via a 2-tuple butterfly network without an access conflict both in a linear order and in an interleaved order.

Then the 4-tuple parallel access rule for four equal size sub frames is derived from $P_2(k)=\{k, 52+k\}$ by the pair function $q_2(k)=\{k, 26+k\}$ for $k=0, 1, 2, \ldots, 25$. In other words, the 2-tuples $P_2(k)$ and $P_2(26+k)$ constitute a 4-tuple. Therefore the 4-tuple parallel access rule $P_4$ is defined as $P_4(k)=\{P_2(k), P_2(26+k)\}=\{k, 52+k, 26+k, 78+k\}$ for $k=0, 1, 2, \ldots, 25$, with N=104. FIG. 3C/Table 3, shows values of the multiple access function F of the parallel access rule $P_4$, for linear and interleaved access order. For example, for linear access order at k=10, the four values of F are F(10)=3, F(62)=0, F(36)=1, and F(88)=2. The control bits of the 4-tuple butterfly network at k=10, is BNL(10)=11, that is, $11_{DEC}=1011_{BIN}$, as a 4-bit binary number. The value BNL(10)=11, is derived from the four values F(10)=$F_0$, F(62)=$F_1$, F(36)=$F_2$, and F(88)=$F_3$, of the multiple access function F as in FIG. 10.

Figure 13:
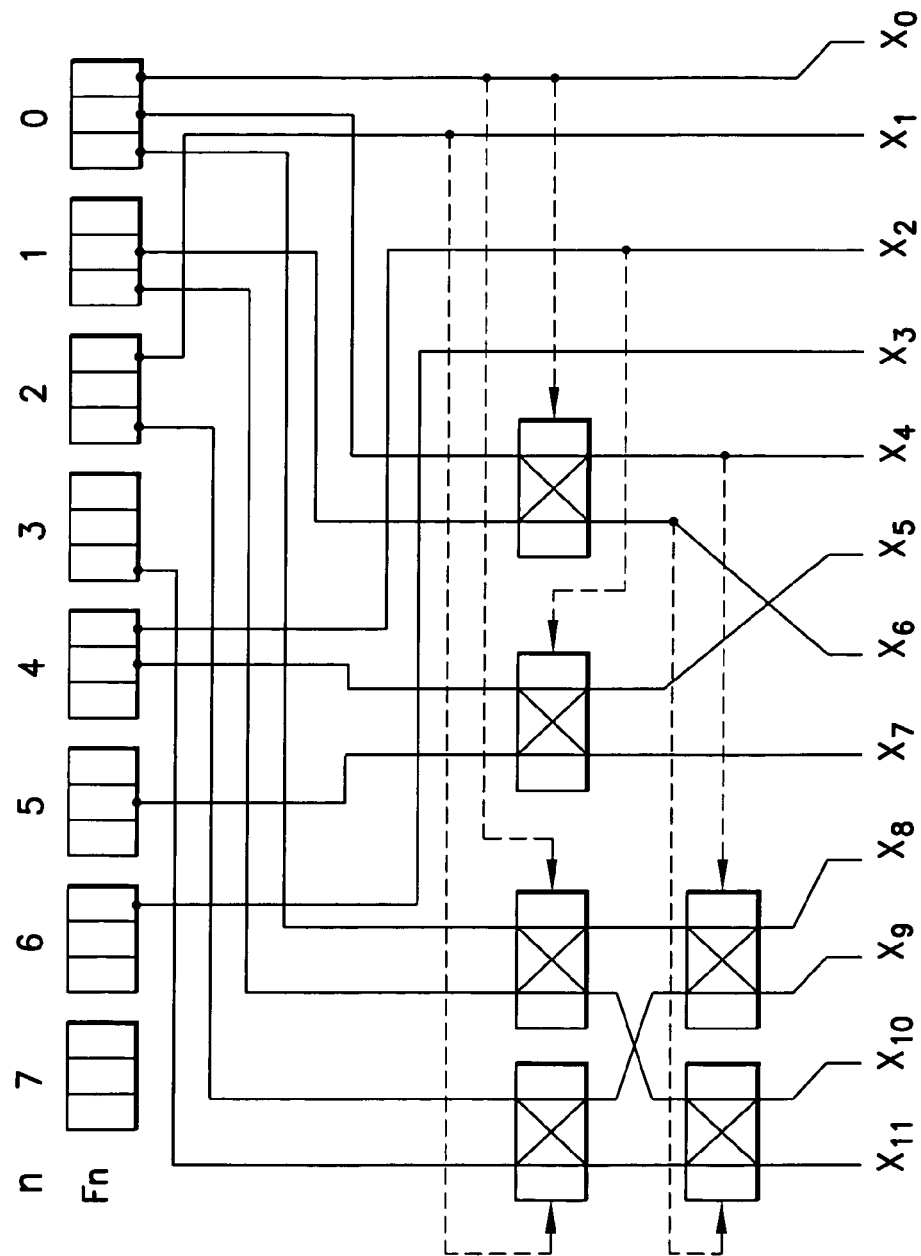
FIG. 13 is a conceptual diagram showing how all twelve control bits are derived from values of a multiple access function $F_n$, for the 8-tuple butterfly network of FIG. 1.

The 8-tuple parallel access rule for eight equal size sub frames is derived from $P_4(k)=\{k, 52+k, 26+k, 78+k\}$ using other pair function $r_2(k)=\{k, 13+k\}$ for $k=0, 1, 2, \ldots, 12$. Hence the 4-tuples $P_4(k)$ and $P_4(13+k)$ constitute a 8-tuple. So the 8-tuple parallel access rule $P_8$, is defined as $P_8(k)=\{P_4(k), P_4(13+k)\}=\{k, 52+k, 26+k, 78+k, 13+k, 65+k, 39+k, 91+k\}$ for $k=0, 1, 2, \ldots, 12$, with N=104. After executing the steps explained in Summary I. with the multiple access rule $P_8$, one has the multiple access function F and control bits for the 8-tuple butterfly network of $P_8$, as listed at FIG. 3D/Table 4, and FIG. 3E/Table 5, for the linear access order and the interleaved access order, respectively. For example, when k=9, for the linear access order, the multiple access function F has values 1, 4, 7, 6, 2, 5, 3, 0, at 9, 61, 35, 87, 22, 74, 48, and 100, respectively. The control bits for the 8-tuple butterfly network at k=9, for the linear access order is $2859_{DEC}=1011\ 0010\ 1011_{BIN}$ as a 12-bit binary number. The values of the multiple access function F in FIG. 3E/Table 5 are in the interleaved order and they generate a different set of control bits for the 8-tuple butterfly network. For example, in the interleaved access order at k=9, the control bits are BNI(9)=$1030_{DEC}=0100\ 0000\ 0110_{BIN}$, as a 12-bit binary number. FIG. 13 shows how the eight values of the multiple access function are mapped to control bits of the 8-tuple butterfly networks.

By looking at FIG. 3D/Table 4, and FIG. 3E/Table 5, one see that for each k all 8-tuples of F have 8, different values on every row. By studying closer values of BNL and BNI one concludes that all 8-tuples of F can be generated by the 8-tuple butterfly network that has a 12-bit wide control signal. As a result, the constructed multiple access function F guarantees a collision free 8-tuple accesses in the linear order and in the interleaved order. In particular, the multiple access function F supports permutations of a butterfly network of degree 8.

Figure 3F:
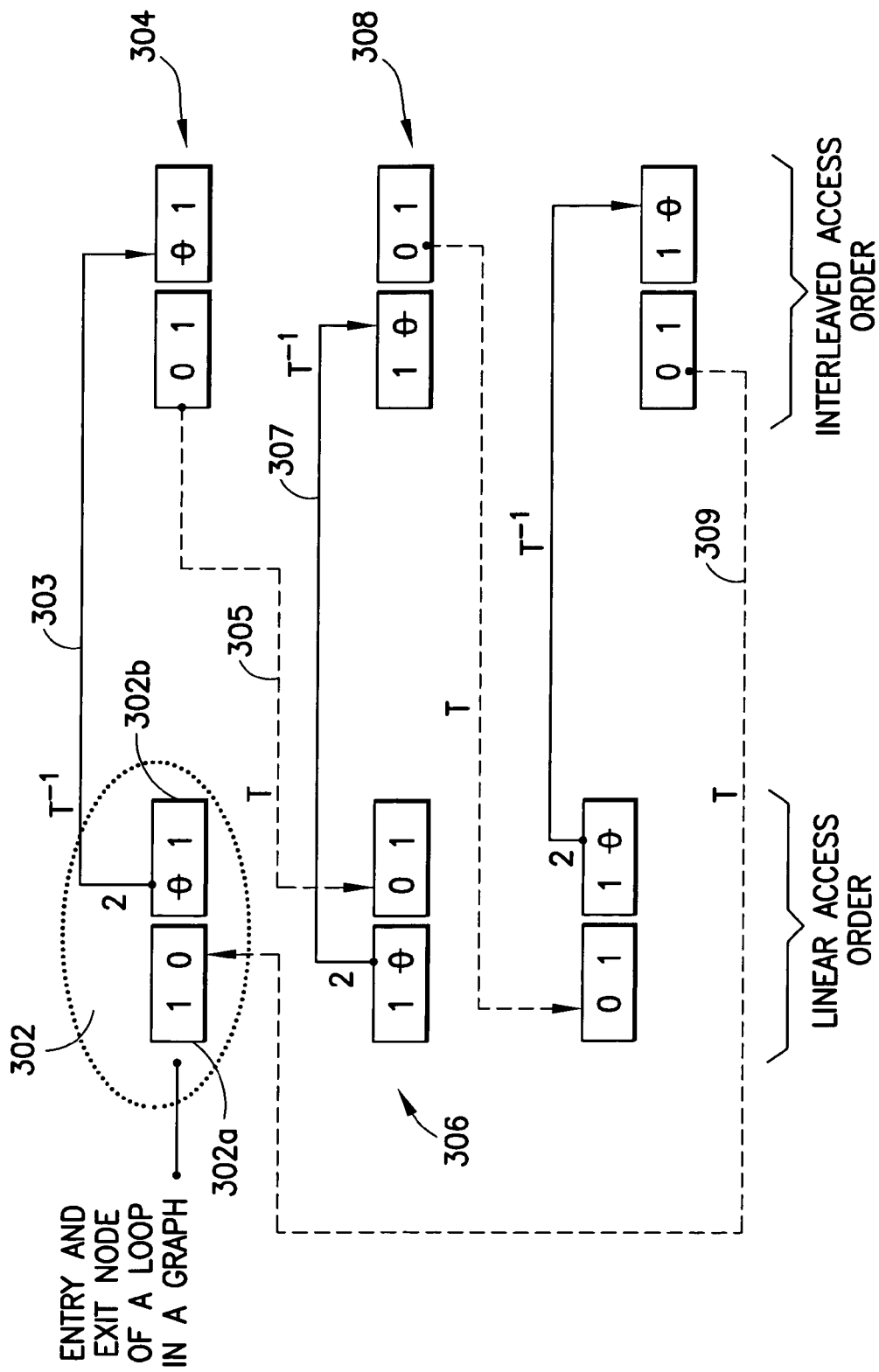
FIG. 3F is a flow diagram illustrating execution of an algorithm that converts between linear access order and interleaver access order for a 4-tuple multiple access function.

FIG. 3F illustrates how the algorithm to construct a multiple access function F replaces half of zeros by twos. In this case the multiple access function F is updated from a 2-tuple multiple access function to a 4-tuple multiple access function. The outer most Repeat-loop of Algorithm II searches for a 4-tuple having two zeros. There must be one zero in both component 2-tuples 302a, 302b. Such a 4-tuple is called the entry and exit node 302 of a loop in FIG. 3F. Then one zero is replaced by two, that is denoted by strikethrough zero and two above the component 2-tuple 302b. Next using a deinterleaver $T^{-1}$, the algorithm moves 303 from a linear access order (on the left) to an interleaver access order (on the right). Solid line arrows illustrate the movement in FIG. 3F. At this step, the algorithm moves 303 from a 2-tuple to its parallel pair 2-tuple defined by a 4-tuple multiple access rule in the interleaved access order shown as block 304. After that the algorithm looks for which component of the 2-tuple has zero. Then the algorithm moves 305 from the interleaved access order back to the linear access order at block 306 using an interleaver. Dashed lines illustrate these movements. The algorithm moves from one 2-tuple to its parallel pair using the linear access order inside a 4-tuple at block 306. The algorithm looks for which 2-tuple component has zero and replaces that zero by two as seen above one of the 2-tuples of block 306. Then the algorithm applies again the deinterleaver $T^{-1}$, to move 307 from the linear access order at block 306 to the interleaver access order at block 308. This process continues as long as the algorithm ends up back to the entry and exit node 302 of the graph. After that the outer most Repeat-loop 309 continues to look for a next possible entry node.

During use, one may begin by identifying a linear access order and an interleaved access order. Next one decides a degree of parallel processing: 2, 4, 8, or higher and a type of parallel processing: which addresses are used in a parallel access. Then the algorithm is applied to construct a multiple access function that associates each address to one memory. Finally, the control bits 20 for the Butterfly networks 18 and 22 are derived from the multiple access function for both the linear access order and the interleaved access order.

As is also shown in FIG. 2, the exemplary embodiments of this invention may be implemented at least in part with a data processor (DP) 26 coupled with a program memory (PROG_, MEM) 28 that stores instructions for executing the algorithm described above. The resulting bits that represent the control signal 20 that are derived from the function can be stored in the buffer 24 prior to the start of the decoding operation, as was noted above.

Note that in an embodiment where the turbo decoder is implemented in a mobile phone or other type of user terminal or device, or when embodied in a network element such as a base station or Node B, there will also be present at least a suitable type of wireless communication receiver 30 for receiving data to be turbo decoded. In a specific embodiment is an apparatus that includes memory means (such as a memory bank) that has a plurality of memories, first switching means (such as a first butterfly network) coupled to the memory means and configured to apply memory addresses to the memory means, second switching means (such as a second Butterfly network) coupled to the memory means and configured to pass data to or from the memory bank, and processing means such as a processor. The processing means has a control output coupled to the first and the second switching means, and is configured to generate a control signal for the first and second switching means in accordance with a multiple access rule to enable parallel access to the memory bank, without memory access conflict, for one of a linear order and an interleaved order.

In the case of a 3G network there are 5075, interleavers for channel codes. The use of the foregoing algorithm has been verified for all 5075, use cases. The exemplary embodiments of this invention have been found to be applicable to all 3G turbo interleavers, with parallel degrees 2, 4, and 8, by initially dividing an address space into even addresses and odd addresses, into 2, 4, or 8, equal size sub address spaces, or into mirror address spaces.

Figure 4:
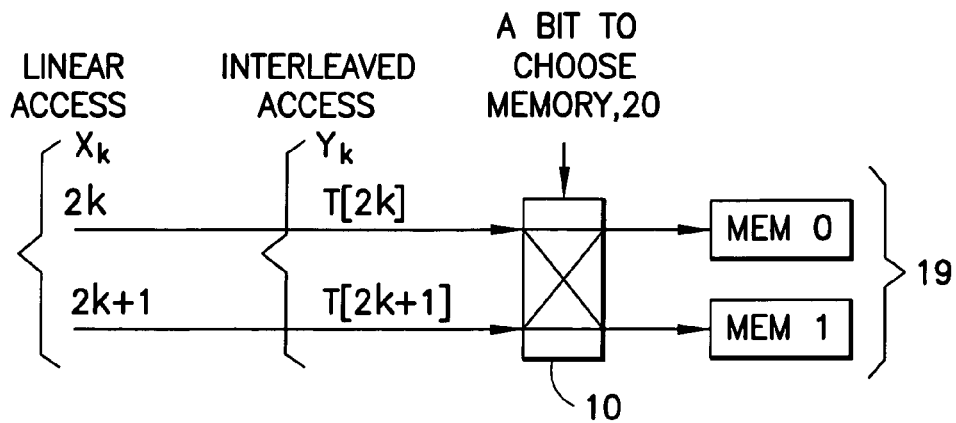
FIG. 4 is a memory bank of size two coupled to a 2-tuple butterfly network showing even-odd access as linear or interleaved using different control signals.

Now specific examples of butterfly networks and their control signals are detailed. FIG. 4 illustrates a simple memory bank 19 of consisting of two submemories, with one switch 10 controlling read and write access. When input data values in even and odd memory addresses are fetched in parallel as pairs, the both a linear access order and an interleaved access order are necessary, and two pairs of addresses {2k, 2k+1} and {T[2k] and T[2k+1]} are applied to the two memories pair by pair for all k=0, 1, 2, . . . (N/2)−1. One control bit 20 is used to control the order of that access since only one switch 10 is used. The control bit for linear access is designated $X_k$, and the control bit for interleaved access is designated $Y_k$. Since there are two memory addresses in the memory bank 19 for storing two data values, FIG. 4 represents a 2-tuple implementation. It then follows from the above algorithm that the control bits for the switch can be defined by:

$$X_k = \begin{cases} 0 & \text{if } F(2k) = Mem0; \\ 1 & \text{otherwise;} \end{cases} \text{ and}$$

$$Y_k = \begin{cases} 0 & \text{if } F(T[2k]) = Mem0; \\ 1 & \text{otherwise;} \end{cases} \text{ for } k = 0, 1, 2, \ldots N/2 - 1.$$

Figure 5:
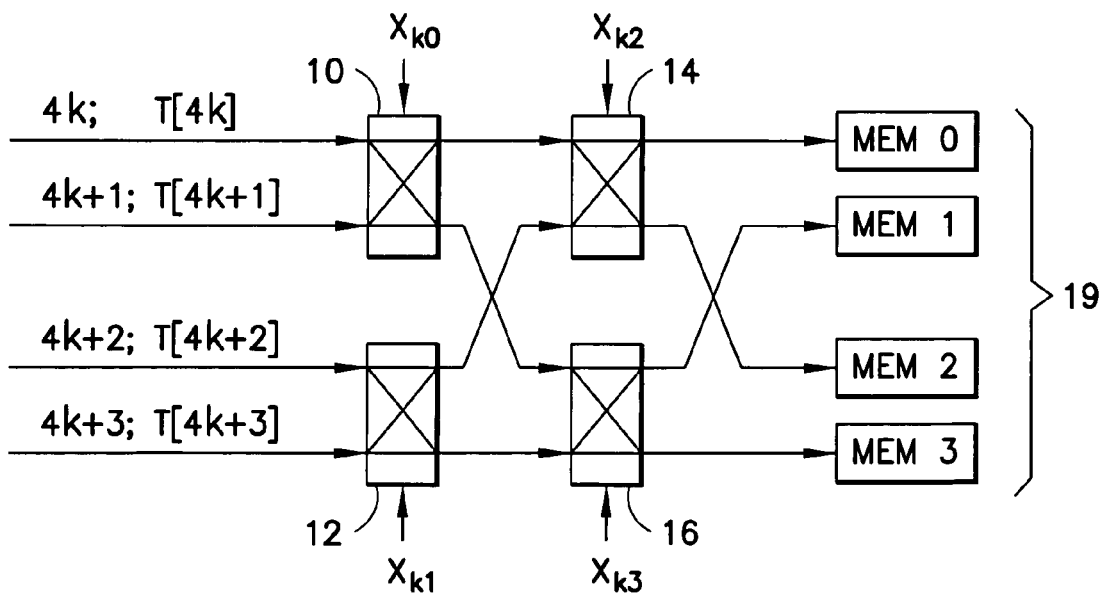
FIG. 5 is similar to FIG. 4 but where a memory bank of size 4, is coupled to a 4-tuple butterfly network, with individual bits of the linear access control signal applied to individual switches of the network.

FIG. 5 is similar to FIG. 4, but for a memory bank 19 of consisting of four submemories. In this network, four data values in each of the consecutive memory addresses are fetched in parallel as 4-tuples, and the range of k=0, 1, 2, . . . (N/4)−1. The four-bit wide control signal for linear access is $X_k = (x_{k3}, x_{k2}, x_{k1}, x_{k0})$, and for interleaved access is $Y_k = (y_{k3}, y_{k2}, y_{k1}, y_{k0})$. Shown in FIG. 5 is each bit of the linear access control signal applied to different ones of the switches 10, 12, 14, 16. The control bits for interleaved access are applied similarly.

Note that the function F from the index set {0, 1, 2, . . . , N/4−1} to the set of memories {Mem 0, Mem 1, Mem 2, Mem 3} is such that F(4k+m)≠F(4k+j) and F(T[4k+m])≠F(T[4k+j]) for all k in {0, 1, 2, . . . , N/4−1} and m=0, 1, 2, 3, and j=0, 1, 2, 3, and m≠j. The butterfly network of degree four shown at FIG. 5 can generate only 16 different permutations out of 24=4!. Fortunately the presented general concept to construct multiple access functions guarantees that obtained functions apply only permutations of butterfly networks. So there is a multiple access function F such that the function applies the permutations of the butterfly network of degree four.

Figure 6:
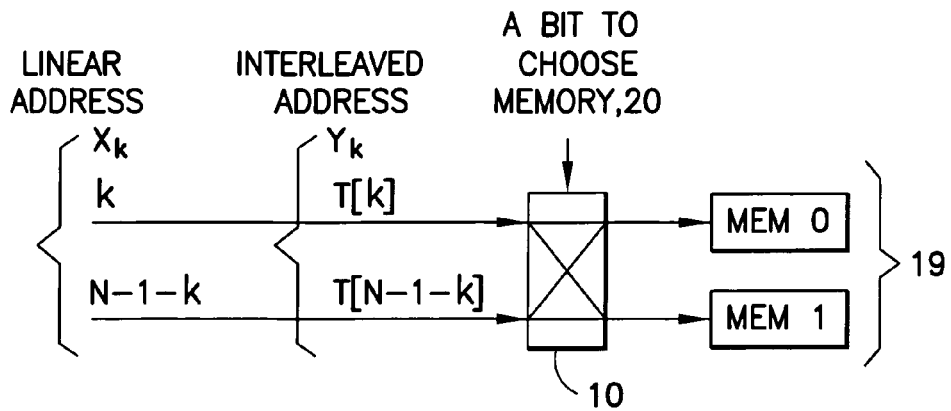
FIG. 6 is similar to FIG. 4 but showing mirror 2-tuple multiple access.
Figure 7:
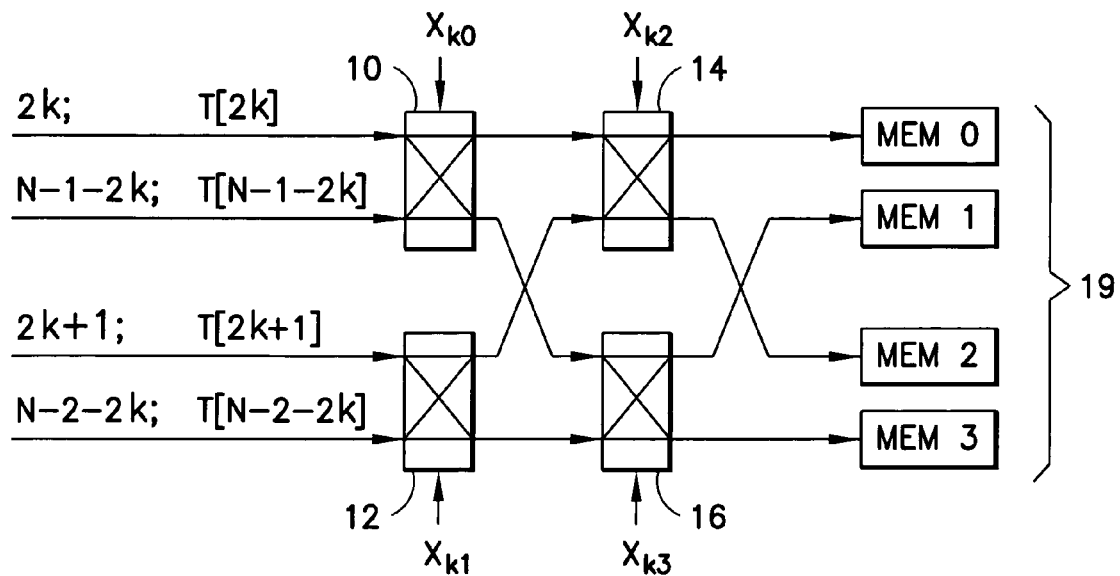
FIG. 7 is similar to FIG. 5 but showing mirror 4-tuple multiple access.

This is met by using mirror 2-tuple access schemes, as is seen at FIGS. 6-7. Pairs of 2-tuples are {k, N−1−k} and {T[k], T[N−k−1]} for k=0, 1, 2, 3, . . . , N/2−1. In this case it is possible to let the index k takes all values in an address space. Consider FIG. 6. Collision free mirror 2-tuple access schemes are based on a function F from the index set {0, 1, 2, 3, . . . , N/2−1} to the memory bank 19 {Mem 0, Mem 1} with the property: F(k)≠F(N−1−k) and F(T[k])≠F(T[N−1−k]) for all k in {0, 1, 2, 3, . . . , N/2−1}. Control bits 20 for the butterfly network of order two are derived from the function F in the same way as detailed above for FIG. 4.

For the 4-tuple multiple access of the network of FIG. 7, implementation of a double speed decoder uses mirror 4-tuple access schemes. Pairs of 4-tuples are now {2k, N−1−2k, 2k+1, N−2−2k} and {T[2k], T[N−1−2k], T[2k+1], T[N−2−2k]} for k=0, 1, 2, . . . , N/4−1. Because indexing is symmetric it is possible to let the index k take values from 0, to N/2−1.

The collision free mirror 4-tuple access schemes stem from a function F from the index set {0, 1, 2, 3, . . . , N/4−1} to the memory bank 19 {Mem 0, Mem 1, Mem 2, Mem 3} with the properties:

(i) none of F(2k), F(N−1−2k), F(2k+1), and F(N−2−2k) are mutually equal for all k in {0, 1, 2, 3, . . . , N/4−1};

(ii) none of F(T[2k]), F(T[N−1−2k]), F(T[2k+1]), and F(T[N−2−2k]) are mutually equal for all k in {0, 1, 2, 3, . . . , N/4−1};

(iii) the function F applies permutations of a butterfly network of degree four.

As with the consecutive 4-tuple access scheme described for FIG. 5, linear order 4-tuples {2k, N−1−2k, 2k+1, N−2−2k} have control signals $X_k=(x_{k3}, x_{k2}, x_{k1}, x_{k0})$, and interleaved 4-tuples {T[2k]], T[N−1−2k], T[2k+1], T[N−2−2k]} have control signals $Y_k=(y_{k3}, y_{k2}, y_{k1}, y_{k0})$.

As can be seen from the above extension of the 2-tuple mirror access scheme of FIG. 6 to the 4-tuple mirror access scheme of FIG. 7, multiple access schemes based on $2^m$-tuple butterfly networks can be designed from lower order $2^{m-1}$-tuples iteratively.

Now the control signals are detailed further. As detailed above, a multiple access function provides control signals for a corresponding butterfly network. A value F(k) is an index of a memory that accommodates a $k^{th}$, data value. The butterfly network maps a data value and its address to a memory to which F(k) points. A degree of a butterfly network determines how many parallel accesses are done within a clock cycle.

FIG. 8 is a table showing input and output pins (for the switches 10, 12, 14, 16) of a butterfly network and a multiple access function F with a linear address and an interleaved address. Different notations are used to distinguish the different levels of parallelism being used. With these notations a butterfly network reroutes a data value of a $k^{th}$, tuple at an input pin j to an output pin $F_{kj}$, for a linear addressing, and to an output pin $F_{Tkj}$, for an interleaved addressing. The ranges of $F_{kj}$, and $F_{Tkj}$, are from 0, 1, 2, . . . , $2^m-1$, where $2^m$, stands for a degree of parallel processing.

As noted above, control signals for a 2-tuple butterfly network are 1-bit wide. There are two types of control signals to construct, one for linear addressing and other one for interleaved addressing. They are:

$X_k=F_{k0}$, and $Y_k=F_{k0}$, for k=0, 1, 2, . . . N/2−1.

This is not the only solution. It is of course possible to choose $F_{k1}$, and $F_{Tk1}$, for control. Both signals are calculated and stored into a memory (e.g., buffer 24 of FIG. 2) before turbo decoding begins. A word length of a memory is 2, and a length is N/2. It is pointed out that no information disappears when constructing control signal from a multiple access function F. Once both control signals have been generated, values of a multiple access function F may be ignored.

Figures 9, 10:
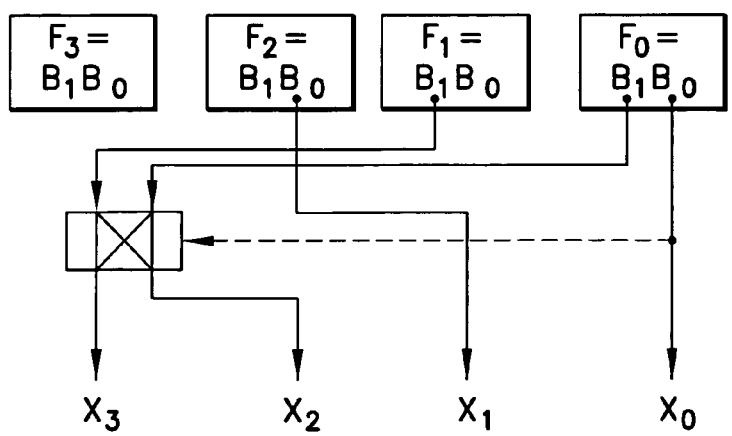
FIG. 9 is a table showing input pin to output pin transitions for a 4-tuple butterfly network.
FIG. 10 is a conceptual diagram showing how values for 4-bit wide control signals are determined.

Control signals $X_k=(X_{k3}, X_{k2}, X_{k1}, X_{k0})$ for a 4-tuple butterfly network are 4-bits wide. A number of 4-bit wide words is N/4. There is one control bit per butterfly network of degree 2. Bits and butterfly networks are associated as in FIG. 5. FIG. 9 shows access control bits for all allowed input-output pin transitions for a butterfly network of degree 4. One input pin to output pin transition impacts to two control bits. The values of the two bits are equal to exclusive-or (XOR) of an input pin number and an output pin number. It follows from FIG. 9 that controls bits $X_k=(X_{k3}, X_{k2}, X_{k1}, X_{k0})$ for a linear addressing can be set by $X_{k0}=F_{k0}$, mod 2, $X_{k1}=F_{k2}$, mod 2, $X_{k2}=(1-X_{k0})*(F_{k0}/2)+X_{k0}*(F_{k1}/2)$, and $X_{k3}=X_{k0}*(F_{k0}/2)+(1-X_{k0})*(F_{k1}/2)$. In the same way control bits $Y_k=(Y_{k3}, Y_{k2}, Y_{k1}, Y_{k0})$ for an interleaved addressing are assigned by $Y_{k0}=F_{Tk0}$, mod 2, $Y_{k1}=F_{Tk2}$ mod 2, $Y_{k2}=(1-Y_{k0})*(F_{Tk0}/2)+Y_{k0}*(F_{Tk1}/2)$, and $Y_{k3}=Y_{k0}*(F_{Tk0}/2)+(1-Y_{k0})*(F_{Tk1}/2)$. Control bits $X_k$, and $Y_k$, are stored into a memory (buffer 24 or addresses 18) of 8-bit wide words and having a length N/4.

FIG. 10 is a conceptual diagram illustrating the formula for setting bit values for 4-bit wide control signals. Because a butterfly network of degree four is able to do sixteen permutations out of twenty-four possible permutations, only three output pin values $F_0$, $F_1$, and $F_2$, determine values for the four control bits. It is noted that four control bits are derived from four bits of output pins such that the exclusive-or (n XOR $F_n$) of an input pin n and an output pin $F_n$, does not change the four bits.

Figure 11:
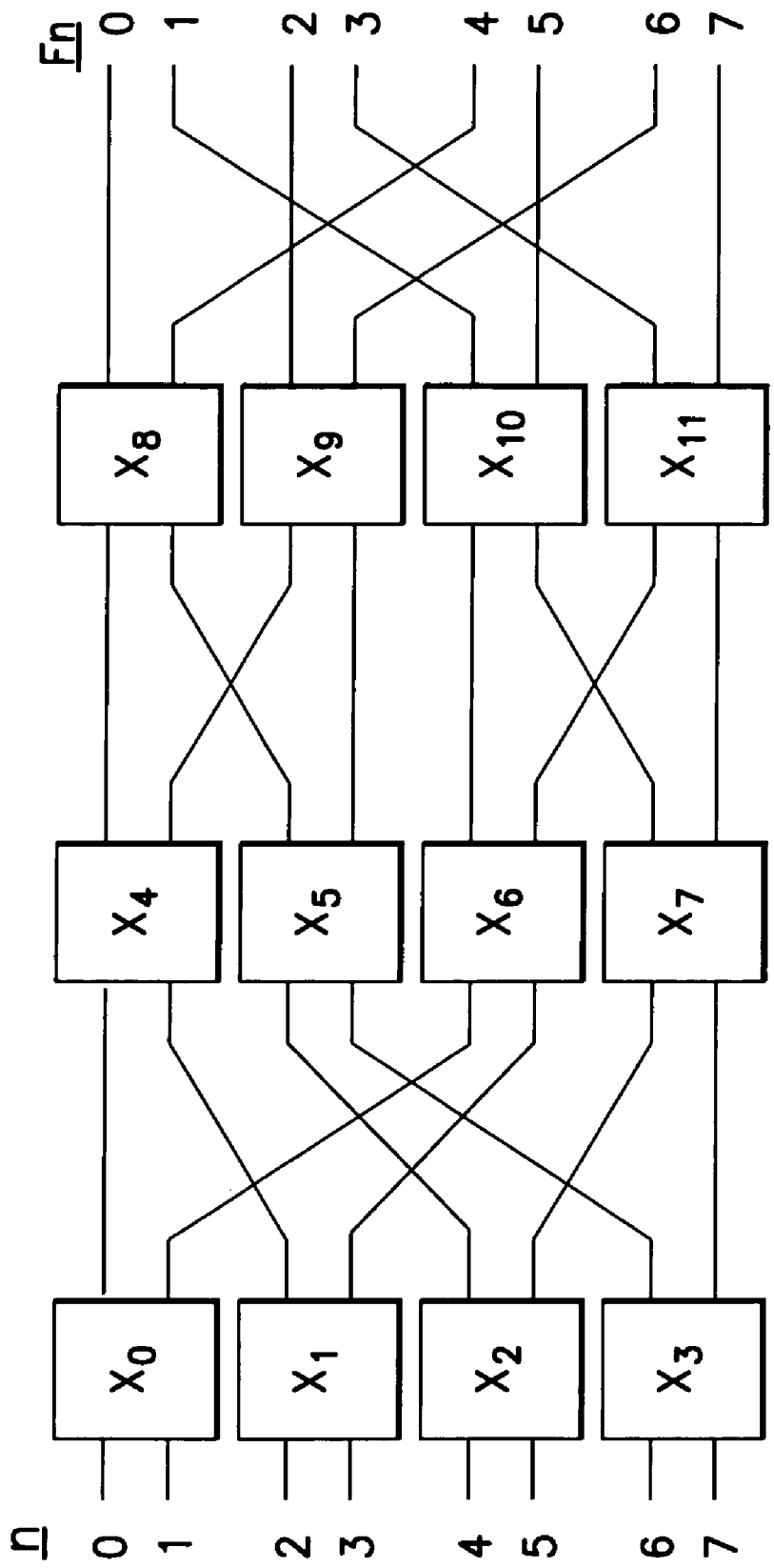
FIG. 11 is a schematic diagram of an 8-tuple butterfly network with twelve switches arranged in three columns, and eight input and eight output pins for the network.

Control signals for 8-tuple butterfly networks are 12-bits wide. As seen in FIG. 11, a butterfly network of degree 8, consists of twelve switches (designated $X_0$, through $X_{11}$, for the linear access control bits that control them), or twelve butterfly networks of degree 2. Input pins are numbered from top to bottom as 0, 1, 2, 3, 4, 5, 6, and 7, and output pins are similarly numbered as 0, 1, 2, 3, 4, 5, 6, and 7. For example, if a linear parallel access is applied at k and $F_{k2}=7$, in FIG. 8, then the 8-tuple butterfly network routes a data from the input pin 2 to the output bin 7. So the control bits $X_1$, $X_6$, and $X_{11}$, have values 1, 0, and 1, respectively.

FIG. 12 is a table showing control bits for allowed routes from input pins 0 and 1. The column of FIG. 12 labeled $nXF_n$, represents (n XOR $F_n$). An input pin n is connected to an output pin $F_n=F_{kn}$, and an output pin $F_n=F_{Tkn}$, for linear access and interleaved access, respectively, as shown in FIG. 11 and in FIG. 8. Each value of a multiple access function F is a 3-bit binary number. A least significant bit of (n XOR $F_n$) assigns a value for one of control bits of the left most column ($X_0$, $X_1$, $X_2$, or $X_3$) of the butterfly networks of degree two. A middle bit of (n XOR $F_n$) is for one of the control bits in the middle column ($X_4$, $X_5$, $X_6$, or $X_7$) of the butterfly networks of degree two. A most significant bit of (n XOR $F_n$) contributes to one of the control bits of the right most column ($X_8$, $X_9$, $X_{10}$, or $X_{11}$) of the butterfly networks of degree two. For example, in FIG. 3E/Table 5, for an interleaved access order for a 8-tuple butterfly network shows that at k=1, the input pin 6 has the output pin $F_6=F_{T1,6}=4$. In other words, the 8-tuple butterfly network connects the input pin 6 to the output bin 4. Now $6=110_{BIN}$, and $4=100_{BIN}$, and it follows that ($110_{BIN}$, XOR $100_{BIN})=010_{BIN}$. The least significant bit 0 of $010_{BIN}$, controls routing of the input pin 6 and so $X_3=0$. The middle bit 1 of the binary number $010_{BIN}$, contributes to $X_5$: $X_5=1$. The most significant bit 0 of $010_{BIN}$, carries a value for $X_8$. The value of BNI(1) in FIG. 3E/Table 5 is 563=0010 0011 0011$_{BIN}$, where three bold fonts indicate positions of bits of $010_{BIN}$, within a 12-bit control signal. Using the three bit field of ($nXF_n$) at FIG. 12 to follow through the 8-tuple network of FIG. 11 gives every possible path through the network originating from pins n=0, or n=1, to any output pin pointed by $F_n$, where the indicated bits indicate a straight path by 0, and a switched path by 1, through switches $X_0, X_1, \ldots X_{11}$. Each of the three-bit value of ($nXF_n$) indicates a path through one switch in one column of the network of FIG. 11.

FIG. 13 illustrates in schematic form how all 12, control bits are derived from values of a multiple access function F. Shown are the input pins n=0, 1, . . . 7; and the output pin $F_n$, corresponding each n represented as a three bit control word that shows the path through the 8-tuple network. Bits from $F_n$, are chosen such that exclusive ORs (XOR) between n and $F_n$, do not influence control bits. Other solutions are possible besides that shown in FIG. 13. It is noted that no information disappears when transforming values of multiple access function F to two control signals of 12-bit width (one for linear access, one for interleaved access). Once the control bits for a linear addressing and an interleaved addressing have been resolved, the multiple access function F is no longer needed. The control bits for the various linear and interleaved addressing are stored in a memory (18) and used for memory storing and access, and the function itself need not be re-executed.

Advantages made possible by the use of the exemplary embodiments of this invention include, but are not limited to, an ability to implement turbo decoders with a higher decoding capacity without increasing the clock frequency, as well as an ability to implement turbo decoders with enhanced decoding speed, while consuming less power than would be required if the same speed increase were obtained by increasing the clock frequency.

In general, the various embodiments of the mobile device can include, but are not limited to, cellular phones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The exemplary embodiments of this invention may be implemented by computer software executable by the DP 26, or by hardware, or by a combination of software and hardware.

The Memories_, 0-3, 24 and 28 may be of any type suitable to the local technical environment and may be implemented using any suitable data storage technology, such as semiconductor-based memory devices, magnetic memory devices and systems, optical memory devices and systems, fixed memory and removable memory. The DP 26 may be of any type suitable to the local technical environment, and may include one or more of general purpose computers, special purpose computers, microprocessors, digital signal processors (DSPS) and processors based on a multi-core processor architecture, as non-limiting examples.

Figure 14:
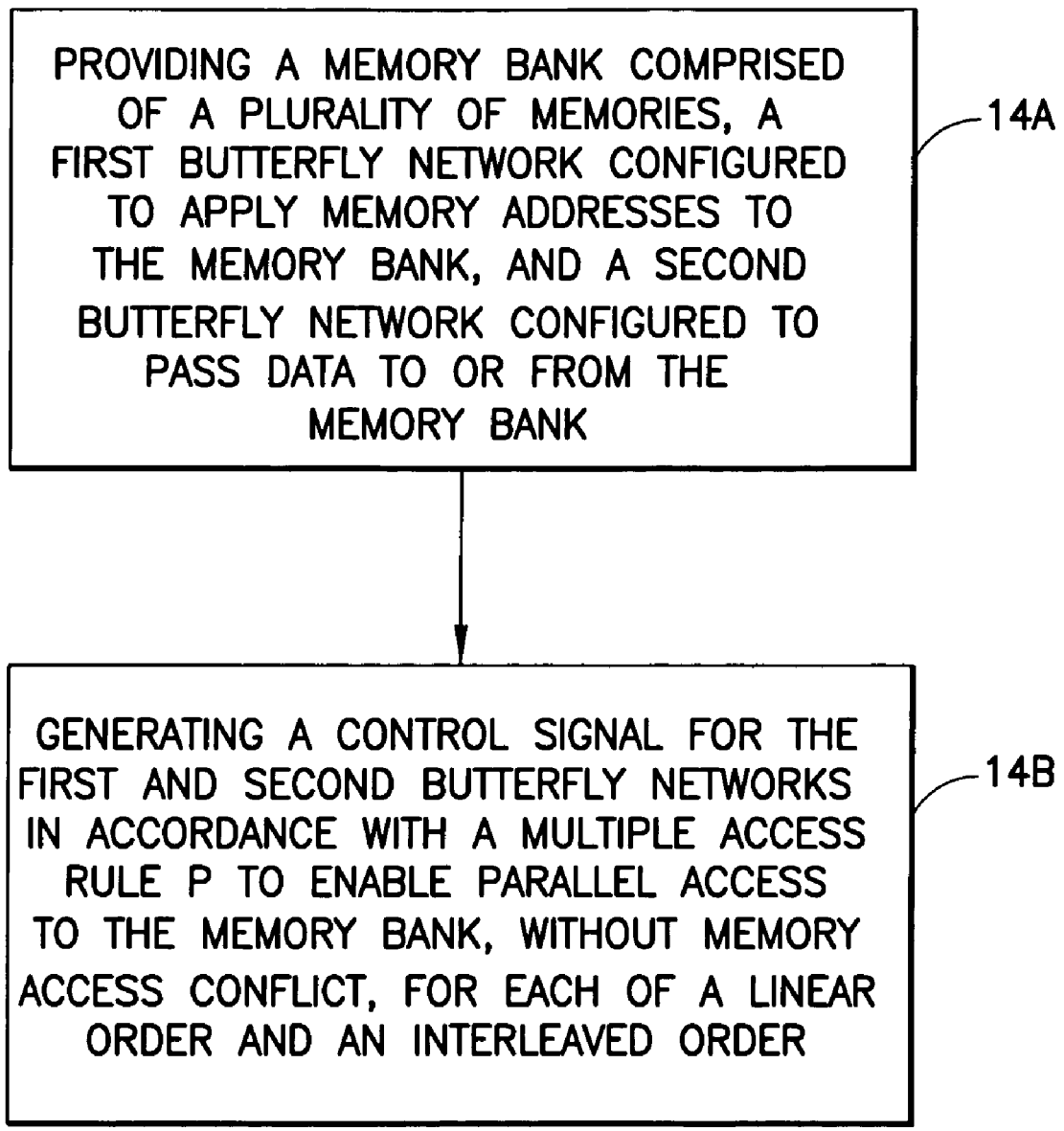
FIG. 14 is a logic flow diagram that is illustrative of a method in accordance with the exemplary embodiments of this invention.

FIG. 14 shows a logic flow diagram that is illustrative of a novel method to control memory accesses during data decoding. The method includes, at Block 14A, providing a memory bank comprised of a plurality of memories, a first Butterfly network configured to apply memory addresses to the memory bank, and a second Butterfly network configured to pass data to or from the memory bank; and, at Block 14B, generating a control signal for the first and second Butterfly networks in accordance with a multiple access rule to enable parallel access to the memory bank, without memory access conflict, for each of a linear order and an interleaved order.

Note that the various blocks shown in FIG. 4 may be viewed as method steps or as operations that result from operation of computer program code.

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

As such, it should be appreciated that at least some aspects of the exemplary embodiments of the inventions may be practiced in various components such as integrated circuit chips and modules. The design of integrated circuits is by and large a highly automated process. Complex and powerful software tools are available for converting a logic level design into a semiconductor circuit design ready to be fabricated on a semiconductor substrate. Such software tools can automatically route conductors and locate components on a semiconductor substrate using well established rules of design, as well as libraries of pre-stored design modules. Once the design for a semiconductor circuit has been completed, the resultant design, in a standardized electronic format (e.g., Opus, GDSII, or the like) may be transmitted to a semiconductor fabrication facility for fabrication as one or more integrated circuit devices.

Various modifications and adaptations may become apparent to those skilled in the relevant arts in view of the foregoing description, when read in conjunction with the accompanying drawings and the appended claims. As but some examples, the use of exemplary embodiments with other than turbo coded data may be attempted by those skilled in the art, as in general the exemplary embodiments may be applied with any suitable type of iterative decoder. However, all such and similar modifications of the teachings of this invention will still fall within the scope of this invention.

Further, while the exemplary embodiments have been described above in the context of, for example, a 3G system, it should be appreciated that the exemplary embodiments of this invention are not limited for use with only this one particular type of wireless communication system, and that they may be used to advantage in other wireless communication systems, including 3.9G (EUTRAN) and future types of systems.

Furthermore, some of the features of the examples of this invention may be used to advantage without the corresponding use of other features. As such, the foregoing description should be considered as merely illustrative of the principles, teachings, examples and exemplary embodiments of this invention, and not in limitation thereof.

What is claimed is:

1. A method comprising:
   providing a memory bank comprised of a plurality of memories, a first Butterfly network configured to apply memory addresses to the memory bank, and a second Butterfly network configured to pass data to or from the memory bank; and
   generating control signals for the first and second Butterfly networks in accordance with a multiple access rule to enable $2^m$-tuple parallel access to the memory bank, without memory access conflict, for a linear order and for an interleaved order, where m is an integer at least one.

2. The method of claim 1, where the linear order has a parallel n-tuple access rule, $n=2^m$, $\{a_0(k), a_1(k), a_2(k), \ldots, a_{n-1}(k)\}$, and the interleaved order has a parallel n-tuple access rule $\{T(a_0(k)), T(a_1(k)), T(a_2(k)), \ldots, T(a_{n-1}(k))\}$ for $k=0, 1, \ldots, N/n-1$, where N is a length of an address space of the memory bank.

3. The method of claim 2, where the multiple access rule is expressed as:
divide the address space into odd and even addresses: $a_0(k)=2*k$ runs thru all even addresses and $a_1(k)=2*k+1$ runs through all odd addresses.

4. The method of claim 2, where the multiple access rule is expressed as:
data is processed as pairs $\{a_0(k), a_1(k)\}$ from the beginning and end of the memory bank: $a_0(k)=k$, and $a_1(k)=N-1-k$ for $k=0, 1, 2, \ldots, N/2-1$, and $m=1$.

5. The method of claim 2, where the multiple access rule is expressed as:
data is processed as pairs $\{a_0(k), a_1(k)\}$ from the beginning and the middle of the memory bank: $a_0(k)=k$, and $a_1(k)=N/2+k$ for $k=0, 1, 2, \ldots N/2-1$, and $m=1$.

6. The method of claim 2, where the multiple access rule is expressed as:
data is processed four consecutive data values in parallel $\{a_0(k), a_1(k), a_2(k), a_3(k)\}$, $a_0(k)=4*k$, $a_1(k)=4*k+1$, $a_2(k)=4*k+2$, and $a_3(k)=4*k+3$ for $k=0, 1, 2, \ldots, N/4-1$, and $m=2$.

7. The method of claim 2, where the multiple access rule is expressed as:
data is processed four data values in parallel such that two value are consecutive from the beginning and end of the memory, $a_0(k)=2*k$, $a_1(k)=2*k+1$, $a_2(k)=N-2-2*k$, and $a_3(k)=N-1-2*k$ for $k=0, 1, 2, \ldots, N/4-1$, and $m=2$.

8. The method of claim 2, where the multiple access rule is expressed as:
data is processed four data values in parallel such that a data frame is split into four equal size sub frames, $a_0(k)=k$, $a_1(k)=N/4+k$, $a_2(k)=N/2+k$, and $a_3(k)=3*N/4+k$ for $k=0, 1, 2, \ldots, N/4-1$, and $m=2$.

9. The method of claim 2, where the multiple access rule is expressed as:
data is processed $2^m$ consecutive data values in parallel $a_p(k)=k*2^m+p$ for $p=0, 1, \ldots 2^m-1$, where $k=0, 1, 2, \ldots, N/2^m-1$.

10. The method of claim 2, where the multiple access rule is expressed as:
data is processed $2^m$ data values in parallel such that $2^m/2$ values are consecutive from the beginning and end of the memory, $a_p(k)=k*2^{m-1}+p$ for $p=0, 1, \ldots 2^{m-1}-1$ and $a_p(k)=N-k*2^{m-1}-(2^m-p)$ for $p=2^{m-1}, 2^{m-1}+1, \ldots 2^m-1$, where $k=0, 1, 2, \ldots, N/2^m-1$.

11. The method of claim 2, where the multiple access rule is expressed as:
data is processed $2^m$ data values in parallel such that a data frame is split into $2^m$ equal size sub frames, $a_p(k)=p*N*2^{-m}+k$ for $p=0, 1, \ldots 2^m-1$, where $k=0, 1, 2, \ldots, N/2^m-1$.

12. The method of claim 1, where an interleaver is denoted by T, where the inverse of T is denoted by $T^{-1}$, where the multiple access rule is denoted by $P_2(k)=\{a_0(k), a_1(k)\}$ and $a\{T(a_0(k)), T(a_1(k))\}$ for $k=0, 1, \ldots N/2-1$ and input pins $a_0$ and $a_1$ of the memory bank, where N represents a length of an address space of the memory bank, where a function F which gives output pins of the memory bank from an address space $0, 1, \ldots N-1$ to two memory components 0 and 1 has initial values $F(j)=0$ for $j=0, 1,2, \ldots, N-1$ so that all data stay in memory component 0 initially, and where the control signals are generated as a result of execution of:

```
assign k = 0;
Repeat
    If F(a₀(k)) = 0 and F(a₁(k)) = 0 then
        start = a₁(k);
        j = a₁(k);
        Repeat
            assign F(j) = 1;
            If T⁻¹ (j) ⁻a₀(n) for some n then
                a = a₁(n);
            else
                a = a₀(n);
            endif
            if T(a) = a₀(m) for some m then
                next j = a₁(m)
            else
                next j = a₀(m)
            endif
            j = next j
        Until j = start;
    endif
    k = next k;
Until all k's have been treated,
``` where the control signals are $X_k=F(a_0(k))$ and $Y_k=F(T(a_0(k)))$ for the linear access order and the interleaved access order, respectively.

13. The method of claim 1, further comprising deriving higher order $2^m$-parallel processing from a lower order $2^{m-1}$-counterpart by dividing an address space of a sub memory t, $t=0, 1, 2, \ldots, 2^{m-1}-1$, into two equal size subsets of the address space of which one of the subsets is associated with a sub memory t and another of the subsets is associated with a sub memory $(t+2^{m-1})$.

14. The method of claim 1, where generating comprises identifying a linear access order and an interleaved access order, identifying a degree of parallel processing and a type of parallel processing, constructing a function that associates each address to one memory, and deriving the control signal from the function.

15. The method of claim 1, where the method is for data decoding and the data that is decoded is turbo coded data.

16. The method of claim 1, in which each of the said butterfly networks comprises a plurality of switches, each switch comprising two inputs and two outputs and controlled by a single control bit.

17. A program of machine-readable instructions, embodied on a tangible memory and executable by a digital data processor, to perform actions directed toward controlling memory access, the actions comprising:
generating a control signal for a first Butterfly network and for a second Butterfly network in accordance with a multiple access rule to enable $2^m$-tuple parallel access to a memory bank, without memory access conflict, for a linear order and for an interleaved order, where m is an interger at least one; and
sending the control signals to the first and second Butterfly networks for respective linear order and interleaved order accesses;
wherein the memory bank comprises a plurality of memories, the first Butterfly network is configured to apply memory addresses to the memory bank, and the second Butterfly network is configured to pass data to and from the memory bank.

18. The program of claim 17, where the linear order has a parallel n-tuple access $n=2^m$, $\{a_0(k), a_1(k), a_2(k), \ldots, a_{n-1}(k)\}$, and the interleaved order has a parallel n-tuple access rule $\{T(a_0(k)), T(a_1(k)), T(a_2(k)), \ldots, T(a_{n-1}(k))\}$ for $k=0, 1, \ldots N/n-1$, where N is a length of an address space of the memory bank.

19. The program of claim 18, where the multiple access rule is expressed as:
   divide the address space into odd and even addresses: $a_0(k)=2*k$ runs thru all even addresses and $a_1(k)=2*k+1$ runs through all odd addresses.

20. The program of claim 18, where the multiple access rule is expressed as:
   data is processed as pairs $\{a_0(k), a_1(k)\}$ from the beginning and end of the memory bank: $a_0(k)=k$, and $a_1(k)=N-1-k$ for $k=0,1,2,\ldots,N/2-1$, and $m=1$.

21. The program of claim 18, where the multiple access rule is expressed as:
   data is processed from the beginning and the middle of the memory bank: $a_0(k)=k$, and $a_1(k)=N/2+k$ for $k=0, 1, 2, \ldots N/2-1$, and $m=1$.

22. The program of claim 18, where the multiple access rule is expressed as:
   data is processed four consecutive data values in parallel $\{a_0(k), a_1(k), a_2(k), a_3(k)\}$, $a_0(k)=4*k$, $a_1(k)=4*k+1$, $a_2(k)=4*k+2$, and $a_3(k)=4*k+3$ for $k=0, 1, 2, \ldots, N/4-1$, and $m=2$.

23. The program of claim 18, where the multiple access rule is expressed as:
   data is processed four data values in parallel such that two value are consecutive from the beginning and end of the memory, $a_0(k)=2*k$, $a_1(k)=2*k+1$, $a_2(k)=N-2-2*k$, and $a_3(k)=N-1-2*k$ for $k=0, 1, 2, \ldots, N/4-1$, and $m=2$.

24. The program of claim 18, where the multiple access rule is expressed as:
   data is processed four data values in parallel such that a data frame is split into four equal size sub frames, $a_0(k)=k$, $a_1(k)=N/4+k$, $a_2(k)=N/2+k$, and $a_3(k)=3*N/4+k$ for $k=0, 1, 2, \ldots, N/4-1$, and $m=2$.

25. The program of claim 18, where the multiple access rule is expressed as:
   data is processed $2^m$ consecutive data values in parallel $a_p(k)=k*2^m+p$ for $p=0, 1, \ldots 2^m-1$, where $k=0, 1, 2, \ldots, N/2^m-1$.

26. The program of claim 18, where the multiple access rule is expressed as:
   data is processed $2^m$ data values in parallel such that $2^m/2$ values are consecutive from the beginning and end of the memory, $a_p(k)=k*2^{m-1}+p$ for $p=0, 1, \ldots 2^{m-1}-1$ and $a_p(k)=N-k*2^{m-1}-(2^m-p)$ for $p=2^{m-1}, 2^{m-1}+1, \ldots 2^m-1$, where $k=0, 1, 2, \ldots, N/2^m-1$.

27. The program of claim 18, where the multiple access rule is expressed as:
   data is processed $2^m$ data values in parallel such that a data frame is split into $2^m$ equal size sub frames, $a_p(k)=p*N*2^{-m}+k$ for $p=0, 1, \ldots 2^m-1$, $k=0, 1, 2, \ldots, N/2^m-1$.

28. The program of claim 17, where an interleaver is denoted by T, where the inverse of T is denoted by $T^{-1}$, where the multiple access rule is denoted by $P_2(k)=\{a_0(k), a_1(k)\}$ and $\{T(a_0(k)), T(a_1(k))\}$ for $k=0, 1, \ldots N/2-1$, and input pins $a_0$ and $a_1$ of the memory bank, where N represents a length of an address space of the memory bank, where a function F which gives output pins of the memory bank from an address space $0, 1, \ldots N-1$ to two memory components 0 and 1 has initial values $F(j)=0$ for $j=0, 1, 2, \ldots, N-1$ so that all data stay in memory component 0 initially, and where the control signals are generated as a result of execution of:

```
assign k = 0;
Repeat
    If F(a_0(k)) = 0 and F (a_1(k)) = 0 then
        start = a_1(k);
        j = a,(k);
        Repeat
            assign F(j) = 1;
            If T^-1 (j) = a_0(n) for some n then
                a = a_1(n);
            else
                a = a_0(n);
            endif
            if T(a) = a_0(m) for some m then
                next j = a_1(m)
            else
                next j = a_0(m)
            endif
            j = next j
        Until j = start;
    endif
    k = next k;
Until all k's have been treated,
``` where the control signals are $X_k=F(a_0(k))$ and $Y_k=F(T(a_0(k)))$ for the linear access order and the interleaved access order, respectively.

29. The program of claim 17, the actions further comprising deriving higher order $2^m$-parallel processing from a lower order $2^{m-1}$ counterpart by dividing an address space of a sub memory t, $t=0, 1, 2, \ldots 2^{m-1}-1$, into two equal size subsets of the address space of which one of the subsets is associated with a sub memory t and another of the subsets is associated with a sub memory $(t+2^{m-1})$.

30. The program of claim 17, where generating comprises identifying a linear access order and an interleaved access order, identifying a degree of parallel processing and a type of parallel processing, constructing a function that associates each address to one memory, and deriving the control signals from the function.

31. The program of claim 17, where the data actions are directed toward controlling memory access during data decoding, and the data that is decoded is turbo coded data.

32. The program of claim 17, in which each of the said butterfly networks comprises a plurality of switches, each switch comprising two inputs and two outputs and controlled by a single control bit.

33. An apparatus comprising:
   a memory bank comprising a plurality of memories;
   a first Butterfly network coupled to the memory bank and configured to apply memory addresses to the memory bank;
   a second Butterfly network coupled to the memory bank and configured to pass data to or from the memory bank; and
   a processor having a control output coupled to the first and the second Butterfly networks, configured to generate control signals for the first and second Butterfly networks in accordance with a multiple access rule to enable $2^m$-tuple parallel access to the memory bank, without memory access conflict, for a linear order and for an interleaved order, where m is an interger at least one.

34. The apparatus of claim 33, where the linear order has a parallel n-tuple access rule, $n=2^m$, $\{a_0(k), a_1(k), a_2(k), \ldots, a_{n-1}(k)\}$, and the interleaved order has a parallel n-tuple access rule $\{T(a_0(k)), T(a_1(k)), T(a_2(k)), \ldots, T(a_{n-1}(k))\}$ for $k=0, 1, \ldots N/n-1$, where and N is a length of an address space of the memory bank.

35. The apparatus of claim 34, where the multiple access rule is expressed as:
divide the address space into odd and even addresses: $a_0(k)=2*k$ runs thru all even addresses and $a_1(k)=2*k+1$ runs through all odd addresses.

36. The apparatus of claim 34, where the multiple access rule is expressed as:
data is processed from the beginning and end of the memory bank: $a_0(k)=k$, and $a_1(k)=N-1-k$ for $k=0, 1, 2, \ldots, N/2-1$, and $m=1$.

37. The apparatus of claim 34, where the multiple access rule is expressed as:
data is processed from the beginning and the middle of the memory bank: $a_0(k)=k$, and $a_1(k)=N/2+k$ for $k=0, 1, 2, \ldots N/2-1$, and $m=1$.

38. The apparatus of claim 34, where the multiple access rule is expressed as:
data is processed four consecutive data values in parallel $\{a_0(k), a_1(k), a_2(k), a_3(k)\}$, $a_0(k)=4*k$, $a_1(k)=4*k+1$, $a_2(k)=4*k+2$, and $a_3(k)=4*k+3$ for $k=0, 1, 2, \ldots, N/4-1$, and $m=2$.

39. The apparatus of claim 34, where the multiple access rule is expressed as:
data is processed four data values in parallel such that two value are consecutive from the beginning and end of the memory, $a_0(k)=2*k$, $a_1(k)=2*k+1$, $a_2(k)=N-2-2*k$, and $a_3(k)=N-1-2*k$ for $k=0, 1, 2, \ldots, N/4-1$, and $m=2$.

40. The apparatus of claim 34, where the multiple access rule is expressed as:
data is processed four data values in parallel such that a data frame is split into four equal size sub frames, $a_0(k)=k$, $a_1(k)=N/4+k$, $a_2(k)=N/2+k$, and $a_3(k)=3*N/4+k$ for $k=0, 1, 2, \ldots, N/4-1$, and $m=2$.

41. The apparatus of claim 34, where the multiple access rule is expressed as:
data is processed $2^m$ consecutive data values in parallel $a_p(k)=k*2^m+p$ for $p=0, 1, \ldots 2^m-1$, where $k=0, 1, 2, \ldots, N/2^m-1$.

42. The apparatus of claim 34, where the multiple access rule is expressed as:
data is processed $2^m$ data values in parallel such that $2^m/2$ values are consecutive from the beginning and end of the memory, $a_p(k)=k*2^{m-1}+p$ for $p=0, 1, \ldots 2^{m-1}-1$ and $a_p(k)=N-k*2^{m-1}-(2^m-p)$ for $p=2^{m-1}, 2^{m-1}+1, \ldots 2^m-1$, where $k=0, 1, 2, \ldots, N/2^m-1$.

43. The apparatus of claim 34, where the multiple access rule is expressed as:
data is processed $2^m$ data values in parallel such that a data frame is split into $2^m$ equal size sub frames, $a_p(k)=p*N*2^{-m}+k$ for $p=0, 1, \ldots 2^m-1$, where $k=0, 1, 2, \ldots, N/2^m-1$.

44. The apparatus of claim 33, where an interleaver is denoted by T, where the inverse of T is denoted by $T^{-1}$, where the multiple access rule is denoted by $P_2(k)=\{a_0(k), a_1(k)\}$ and $\{T(a_0(k)), T(a_1(k))\}$ for $k=0, 1, \ldots N/2-1$, and input pins $a_0$ and $a_1$ of the memory bank, where N represents a length of an address space of the memory bank, where a function F which gives output pins of the memory bank from an address space $0, 1, \ldots N-1$ to two memory components 0 and 1 has initial values $F(j)=0$ for $j=0, 1, 2, \ldots, N-1$ so that all data stay in memory component 0 initially, and where the control signals are generated as a result of execution of:

```
assign k = 0;
Repeat
    If F(a_0(k)) = 0 and F(a_1(k)) = 0 then
        start = a_1(k);
        j = a_1(k);
        Repeat
            assign F(j) = 1;
            If T^-1 (j) = a_0(n) for some n then
                a = a_1(n);
            else
                a = a_0(n);
            endif
            if T(a) = a_0(m) for some m then
                next j = a_1(m)
            else
                next j = a_0(m)
            endif
            j = next j
        Until j = start;
    endif
    k = next k;
Until all k's have been treated,
``` where the control signals are $X_k=F(a_0(k))$ and $Y_k=F(T(a_0(k)))$ for $k=0, 1, 2, \ldots, N/2-1$, for the linear access order and the interleaved access order, respectively.

45. The apparatus of claim 33, wherein the processor is configured to generate the control signal by deriving higher order $2^m$-parallel processing from a lower order $2^{m-1}$ counterpart by dividing an address space of a sub memory t, $t=0, 1, 2, \ldots 2^{m-1}-1$, into two equal size subsets of the address space of which one subset is associated with a sub memory t and another of the subsets is associated with a sub memory $(t+2^{m-1})$.

46. The apparatus of claim 33, wherein the processor is configured to generate the control signals by identifying a linear access order and an interleaved access order, identifying a degree of parallel processing and a type of parallel processing, constructing a function that associates each address to one memory, and deriving the control signals from the function.

47. The apparatus of claim 33, where the data that is passed is turbo coded data for decoding.

48. The apparatus of claim 33, in which each of the said butterfly networks comprises a plurality of switches, each switch comprising two inputs and two outputs and controlled by a single control bit.

* * * * *

UNITED STATES PATENT AND TRADEMARK OFFICE
CERTIFICATE OF CORRECTION

PATENT NO. : 8,051,239 B2
APPLICATION NO. : 11/810199
DATED : November 1, 2011
INVENTOR(S) : Nieminen It is certified that error appears in the above-identified patent and that said Letters Patent is hereby corrected as shown below:

Claim 1, col. 16, line 54 delete "or" and insert --and--.

Claim 28, col. 20, line 7 delete "j=a,(k)" and insert --j=a 1(k)--.

Claim 31, col. 20, line 39 delete "data" in between the and actions.

Claim 33, col. 20, line 52 delete "or" and insert --and--.

Claim 33, col. 20, line 55 insert --the-- in between and and second.

Signed and Sealed this
Fourteenth Day of February, 2012

David J. Kappos
*Director of the United States Patent and Trademark Office*